United States Patent
DeLaCruz et al.

(10) Patent No.: US 11,894,345 B2
(45) Date of Patent: *Feb. 6, 2024

(54) INTEGRATED VOLTAGE REGULATOR AND PASSIVE COMPONENTS

(71) Applicant: Adeia Semiconductor Inc., San Jose, CA (US)

(72) Inventors: Javier A DeLaCruz, San Jose, CA (US); Don Draper, San Jose, CA (US); Belgacem Haba, Saratoga, CA (US); Ilyas Mohammed, Santa Clara, CA (US)

(73) Assignee: Adeia Semiconductor Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/058,677

(22) Filed: Nov. 23, 2022

(65) Prior Publication Data

US 2023/0090121 A1    Mar. 23, 2023

Related U.S. Application Data

(63) Continuation of application No. 16/397,202, filed on Apr. 29, 2019, now Pat. No. 11,515,291.
(Continued)

(51) Int. Cl.
*H01L 25/065* (2023.01)
*H01L 23/00* (2006.01)
(Continued)

(52) U.S. Cl.
CPC ........ *H01L 25/0657* (2013.01); *H01L 23/552* (2013.01); *H01L 24/08* (2013.01);
(Continued)

(58) Field of Classification Search
CPC .............. H01L 25/0657; H01L 23/552; H01L 24/08; H01L 23/5227; H01L 2224/08145;
(Continued)

(56) References Cited

U.S. PATENT DOCUMENTS 4,998,665 A    3/1991   Hayashi
5,087,585 A    2/1992   Hayashi
(Continued)

FOREIGN PATENT DOCUMENTS

EP       1441410 A1    7/2004
JP    2000-100679 A    4/2000
(Continued)

OTHER PUBLICATIONS

Amirfeiz et ai., "Formation of Silicon Structures by Plasma-Activated Wafer Bonding", Journal of the Electrochemical Society, 2000, vol. 147, No. 7, pp. 2693-3698.
(Continued)

*Primary Examiner* — Patricia D Valenzuela
(74) *Attorney, Agent, or Firm* — Knobbe, Martens, Olson & Bear, LLP

(57) ABSTRACT

It is highly desirable in electronic systems to conserve space on printed circuit boards (PCB). This disclosure describes voltage regulation in electronic systems, and more specifically to integrating voltage regulators and associated passive components into semiconductor packages with at least a portion of the circuits whose voltage(s) they are regulating.

22 Claims, 24 Drawing Sheets

Related U.S. Application Data

(60) Provisional application No. 62/723,897, filed on Aug. 28, 2018.

(51) Int. Cl.
    *H01L 23/552*    (2006.01)
    *H01L 23/522*    (2006.01)
    *H01L 21/78*    (2006.01)

(52) U.S. Cl.
    CPC .......... *H01L 21/78* (2013.01); *H01L 23/5223* (2013.01); *H01L 23/5227* (2013.01); *H01L 2224/08145* (2013.01); *H01L 2224/32145* (2013.01); *H01L 2225/06524* (2013.01); *H01L 2225/06537* (2013.01); *H01L 2225/06586* (2013.01); *H01L 2924/1427* (2013.01); *H01L 2924/1432* (2013.01); *H01L 2924/3025* (2013.01)

(58) Field of Classification Search
    CPC ........... H01L 2224/32145; H01L 2225/06524; H01L 2225/06537; H01L 2225/06586; H01L 2924/1427; H01L 2924/1432; H01L 2924/3025; H01L 23/645; H01L 25/16; H01L 24/13; H01L 24/16; H01L 24/32; H01L 24/73; H01L 2224/0401; H01L 2224/08221; H01L 2224/08265; H01L 2224/13025; H01L 2224/131; H01L 2224/16227; H01L 2224/32225; H01L 2224/73204; H01L 2224/73251; H01L 2924/15311; H01L 2924/19041; H01L 2924/19042; H01L 2924/19043; H01L 2924/19103; H01L 2924/19104; H01L 23/5223; H01L 21/78; H01F 17/0013; H01F 17/0033; H01F 17/06
    See application file for complete search history.

(56) References Cited

U.S. PATENT DOCUMENTS

| | | | |
|---|---|---|---|
| 5,322,593 A | 6/1994 | Hasegawa et al. | |
| 5,408,053 A | 4/1995 | Young | |
| 5,471,090 A | 11/1995 | Deutsch et al. | |
| 5,753,536 A | 5/1998 | Sugiyama et al. | |
| 5,771,555 A | 6/1998 | Eda et al. | |
| 5,985,739 A | 11/1999 | Plettner et al. | |
| 5,998,808 A | 12/1999 | Matsushita | |
| 6,008,126 A | 12/1999 | Leedy | |
| 6,080,640 A | 6/2000 | Gardner et al. | |
| 6,115,264 A | 9/2000 | Nosaka | |
| 6,265,775 B1 | 7/2001 | Seyyedy | |
| 6,300,161 B1 | 10/2001 | Goetz et al. | |
| 6,374,770 B1 | 4/2002 | Lee et al. | |
| 6,418,029 B1 | 7/2002 | McKee et al. | |
| 6,423,640 B1 | 7/2002 | Lee et al. | |
| 6,465,892 B1 | 10/2002 | Suga | |
| 6,638,808 B1 | 10/2003 | Ochi | |
| 6,713,871 B2 | 3/2004 | Searls et al. | |
| 6,759,692 B1 | 7/2004 | Ochi | |
| 6,864,585 B2 | 3/2005 | Enquist | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,078,811 B2 | 7/2006 | Suga | |
| 7,105,980 B2 | 9/2006 | Abbott et al. | |
| 7,126,212 B2 | 10/2006 | Enquist et al. | |
| 7,193,423 B1 | 3/2007 | Dalton et al. | |
| 7,339,798 B2 | 3/2008 | Chakravorty | |
| 7,354,798 B2 | 4/2008 | Pogge et al. | |
| 7,355,836 B2 | 4/2008 | Radhakrishnan et al. | |
| 7,485,968 B2 | 2/2009 | Enquist et al. | |
| 7,705,691 B2 | 4/2010 | Lu et al. | |
| 7,741,724 B2 | 6/2010 | Morikawa et al. | |
| 7,746,663 B2 | 6/2010 | Hashimoto | |
| 7,750,488 B2 | 7/2010 | Patti et al. | |
| 7,803,693 B2 | 9/2010 | Trezza | |
| 8,009,763 B2 | 8/2011 | Risk et al. | |
| 8,130,821 B2 | 3/2012 | Hopkins et al. | |
| 8,183,127 B2 | 5/2012 | Patti et al. | |
| 8,241,961 B2 | 8/2012 | Kim et al. | |
| 8,314,007 B2 | 11/2012 | Vaufredaz | |
| 8,349,635 B1 | 1/2013 | Gan et al. | |
| 8,357,931 B2 | 1/2013 | Schieck et al. | |
| 8,377,798 B2 | 2/2013 | Peng et al. | |
| 8,441,131 B2 | 5/2013 | Ryan | |
| 8,476,146 B2 | 7/2013 | Chen et al. | |
| 8,476,165 B2 | 7/2013 | Trickett et al. | |
| 8,482,132 B2 | 7/2013 | Yang et al. | |
| 8,483,253 B2 | 7/2013 | Budd et al. | |
| 8,501,537 B2 | 8/2013 | Sadaka et al. | |
| 8,524,533 B2 | 9/2013 | Tong et al. | |
| 8,558,636 B2 * | 10/2013 | Shin ...................... | H01L 23/66 361/761 |
| 8,620,164 B2 | 12/2013 | Heck et al. | |
| 8,647,987 B2 | 2/2014 | Yang et al. | |
| 8,697,493 B2 | 4/2014 | Sadaka | |
| 8,698,323 B2 | 4/2014 | Mohammed et al. | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 8,916,448 B2 | 12/2014 | Cheng et al. | |
| 8,988,299 B2 | 3/2015 | Kam et al. | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,179,584 B2 | 11/2015 | La Porta et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,263,186 B2 | 2/2016 | Li et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,368,866 B2 | 6/2016 | Yu | |
| 9,385,024 B2 | 7/2016 | Tong et al. | |
| 9,391,143 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,202 B2 | 11/2016 | Hashimoto | |
| 9,496,239 B1 | 11/2016 | Edelstein et al. | |
| 9,536,848 B2 | 1/2017 | England et al. | |
| 9,537,199 B2 | 1/2017 | Dang et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,671,572 B2 | 6/2017 | Decker et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,881,882 B2 | 1/2018 | Hsu et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |

(56) References Cited

U.S. PATENT DOCUMENTS

| | | |
|---|---|---|
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,296,053 B2 | 4/2022 | Uzoh et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,367,652 B2 | 6/2022 | Uzoh et al. |
| 11,373,963 B2 | 6/2022 | DeLaCruz et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,393,779 B2 | 7/2022 | Gao et al. |
| 11,462,419 B2 | 10/2022 | Haba |
| 11,476,213 B2 | 10/2022 | Haba et al. |
| 11,515,291 B2 * | 11/2022 | Delacruz ............... H01L 25/16 |
| 2002/0000328 A1 | 1/2002 | Motomura et al. |
| 2002/0003307 A1 | 1/2002 | Suga |
| 2002/0131715 A1 | 9/2002 | Brady |
| 2003/0081906 A1 | 5/2003 | Filhaber et al. |
| 2003/0168716 A1 | 9/2003 | Lee et al. |
| 2004/0084414 A1 | 5/2004 | Sakai et al. |
| 2004/0149991 A1 | 8/2004 | Won |
| 2004/0155692 A1 | 8/2004 | Ochi |
| 2004/0207043 A1 | 10/2004 | Matsunaga et al. |
| 2005/0063134 A1 | 3/2005 | Kim et al. |
| 2005/0135041 A1 | 6/2005 | Kang et al. |
| 2005/0190808 A1 | 9/2005 | Yonekura et al. |
| 2005/0231303 A1 | 10/2005 | Chang et al. |
| 2006/0012966 A1 | 1/2006 | Chakravorty |
| 2006/0017144 A1 | 1/2006 | Uematsu et al. |
| 2006/0057945 A1 | 3/2006 | Hsu et al. |
| 2006/0145778 A1 | 7/2006 | Pleva et al. |
| 2007/0045814 A1 | 3/2007 | Yamamoto et al. |
| 2007/0085165 A1 | 4/2007 | Oh et al. |
| 2007/0096294 A1 | 5/2007 | Ikeda et al. |
| 2007/0111386 A1 | 5/2007 | Kim et al. |
| 2007/0147014 A1 | 6/2007 | Chang et al. |
| 2007/0222048 A1 | 9/2007 | Huang |
| 2007/0295456 A1 | 12/2007 | Gudeman et al. |
| 2008/0124835 A1 | 5/2008 | Chen et al. |
| 2008/0241667 A1 | 10/2008 | Kohn |
| 2009/0206962 A1 | 8/2009 | Chou et al. |
| 2009/0242252 A1 | 10/2009 | Tanaka |
| 2011/0115579 A1 | 5/2011 | Rofougaran |
| 2011/0290552 A1 | 12/2011 | Palmateer et al. |
| 2012/0013499 A1 | 1/2012 | Hayata |
| 2012/0147516 A1 | 6/2012 | Kim et al. |
| 2012/0168217 A1 | 7/2012 | Hsu et al. |
| 2012/0212384 A1 | 8/2012 | Kam et al. |
| 2013/0009325 A1 | 1/2013 | Mori et al. |
| 2013/0063863 A1 | 3/2013 | Timler et al. |
| 2013/0105943 A1 | 5/2013 | Lai et al. |
| 2013/0207234 A1 | 8/2013 | Ikeda et al. |
| 2013/0265733 A1 | 10/2013 | Herbsommer et al. |
| 2013/0286544 A1 | 10/2013 | Azais |
| 2014/0001568 A1 | 1/2014 | Wang et al. |
| 2014/0048908 A1 | 2/2014 | Chen et al. |
| 2014/0116761 A1 | 5/2014 | Lee et al. |
| 2014/0145338 A1 | 5/2014 | Fujii et al. |
| 2014/0175629 A1 | 6/2014 | Sun et al. |
| 2014/0175655 A1 | 6/2014 | Chen et al. |
| 2014/0177189 A1 | 6/2014 | Liu et al. |
| 2014/0184351 A1 | 7/2014 | Bae et al. |
| 2014/0225795 A1 | 8/2014 | Yu |
| 2014/0252635 A1 | 9/2014 | Tran |
| 2014/0264751 A1 | 9/2014 | Chen et al. |
| 2014/0264948 A1 | 9/2014 | Chou et al. |
| 2014/0370658 A1 | 12/2014 | Tong et al. |
| 2014/0377946 A1 | 12/2014 | Cha et al. |
| 2015/0064498 A1 | 3/2015 | Tong |
| 2015/0097298 A1 | 4/2015 | Chen et al. |
| 2015/0194379 A1 | 7/2015 | Chen et al. |
| 2015/0206902 A1 | 7/2015 | Chen et al. |
| 2015/0221571 A1 | 8/2015 | Chaparala et al. |
| 2015/0235952 A1 | 8/2015 | Pan et al. |
| 2015/0270209 A1 | 9/2015 | Woychik et al. |
| 2015/0318618 A1 | 11/2015 | Chen et al. |
| 2016/0077294 A1 | 3/2016 | Jou et al. |
| 2016/0111404 A1 | 4/2016 | Sanders et al. |
| 2016/0155677 A1 | 6/2016 | Bonart et al. |
| 2016/0190113 A1 | 6/2016 | Sharan |
| 2016/0197630 A1 | 7/2016 | Kawasaki |
| 2016/0201265 A1 | 7/2016 | Kosonen et al. |
| 2016/0233195 A1 | 8/2016 | Nagai |
| 2016/0254345 A1 | 9/2016 | Singh et al. |
| 2016/0276727 A1 * | 9/2016 | Dang ............... H01Q 1/50 |
| 2016/0309578 A1 | 10/2016 | Park |
| 2016/0343682 A1 | 11/2016 | Kawasaki |
| 2016/0372449 A1 | 12/2016 | Rusu et al. |
| 2017/0019086 A1 | 1/2017 | Dueweke |
| 2017/0062366 A1 | 3/2017 | Enquist |
| 2017/0062409 A1 | 3/2017 | Basker et al. |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0315299 A1 | 11/2017 | Mathai et al. |
| 2017/0338214 A1 | 11/2017 | Uzoh et al. |
| 2017/0343498 A1 | 11/2017 | Kalnitsky et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |

(56) References Cited

U.S. PATENT DOCUMENTS

| | | |
|---|---|---|
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043817 A1 | 2/2020 | Shen et al. |
| 2020/0075534 A1 | 3/2020 | Gao et al. |
| 2020/0075553 A1 | 3/2020 | DeLaCruz et al. |
| 2020/0227367 A1 | 7/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |

FOREIGN PATENT DOCUMENTS

| | | |
|---|---|---|
| JP | 2001-102479 A | 4/2001 |
| JP | 2002-353416 A | 12/2002 |
| JP | 2003-043281 A | 2/2003 |
| JP | 2008258258 A | 10/2008 |
| JP | 2013-033786 A | 2/2013 |
| JP | 2018-160519 | 10/2018 |
| KR | 2008-0105797 A | 12/2008 |
| KR | 2015-0097798 A | 8/2015 |
| WO | WO 2005/043584 A2 | 5/2005 |
| WO | WO 2005/064646 A2 | 7/2005 |
| WO | WO 2006/100444 A1 | 9/2006 |
| WO | WO 2012125237 A2 | 9/2012 |
| WO | WO 2017151442 A1 | 9/2017 |

OTHER PUBLICATIONS

Chung et al., "Room temperature GaAs—Si and InP—Si wafer direct bonding by teh surface activate bonding method," Nuclear Instruments and Methods in Physics Research BI21, 1997, pp. 203-206.

Chung et al., "Room temperature GaAseu+Si and InPeu+Si wafer direct bonding by teh surface active bonding method," Nuclear Instruments and Methods in Physics Research Section B: Bean Interactions with Materials and Atoms, Jan. 2, 1997, vol. 121, issues 1-4, pp. 203-206.

Chung et al., "Wafer direct bonding of compound semiconductors and silicon at room temperature by the surface activated bonding method", Applied Surface Science, Jun. 2, 1997, vol. 117-118, pp. 808-812.

Farrens et al., "Chemical Free Room Tempreature Wafer to Wafer Direct Bonding", Journal of Electrochemical Society., col. 142, No. 11, Nov. 1995, pp. 3949-3955.

Gosele et al., "Semiconductor Wafer Bonding: A flexible approach to materials combinations in microelectronics; micromechanics and optoelectronics," IEEE, 1997, pp. 23-32.

Hosoda et al., "Effect of the surface treatment on the room-temperature bonding of Al to Si and SiO2", Journal of Materials Science, Jan. 1, 1998, vol. 33, Issue 1, pp. 253-258.

Howlader et al., "A novel method for bonding of ionic wafers," Electronics Components and Technology Conference, 2006, IEEE, pp. 7-pp.

Howlader et al., "Bonding of p-Si/n-InP wafers through surface activated bonding method at room temperature," Indimn Phosphide and Related Materiais.2001, IEEE International Conference On, pp. 272-275.

Howlader et al., "Characterization of the bonding strength and interface current of p-SiOn-InP wafers bonded by surface activated bonding method at room temperature", Journal of Applied Physics, Mar. 1, 2002, vol. 91, No. 5. pp. 3062-3066.

Howlader et al., "Investigation of the bonding strength and interface current", J. Vac. Sci. Technol. B 19(6) Nov./Dec. 2001. pp. 2114-2118.

International Search Report and Written Opinion dated Jan. 9, 2018, issued in International Application No. PCT/US2017/052409, 17 pages.

International Search Report and Written Opinion dated Mar. 22, 2018, issued in International Application No. PCT/US2017/064735, 13 pages.

International Search Report and Written Opinion dated Mar. 7, 2019, in International Application No. PCT/US2018/060044, 9 pages.

International Search Report and Written Opinion dated Apr. 22, 2019, in International Application No. PCT/US2018/064982, 11 pages.

(56) References Cited

OTHER PUBLICATIONS

International Search Report and Written Opinion dated Apr. 23, 2018, issued in International Application No. PCT/US2017/068788, 11 pages.
International Search Report and Written Opinion dated May 29, 2017, issued in International Application No. PCT /US2016/067132, 11 pp.
International Search Report and Written Opinion dated Jul. 17, 2018, issued in International Application No. PCT/US2018/025241, 13 pages.
Itch et al., "Characteristics of low force contact process for MEMS probe cards," Sensors and Actuators A: Physical, vols. 9x 98, 2002, pp. 462-467, ISSN 0924-4247, https://doi.org/10.1016/S0924-4247(01)00822-6 (https://www.sciencedirect.com/sciencelarticle/pii/S0924424701008226).
Itoh et al., "Room temperature vacuum sealing using surface activated bonding method," the 12th International Conference on Solid State Sensors, Actuators and Microsystems, Boston, Jun. 8-12, 2003, 2003 IEEE, pp. 1828-1831.
Itoh et al., "Characteristics of fritting contacts utilized for rnicromachined wafer probe cards", 2000, American Institute of Physics, AIP Review of Scientific Instuments, vol. 71, 2000, pp. 2224-2227.
Itoh T., Kataoka K., Suga T. (2002) Development of Mems IC Probe Card Utilizing Fritting Contact. In: Inasaki I. ( eds) Initiatives of Precision Engineering at the Beginning of a Millennium. Springer, Boston, MA. https://doi.org/10.1007/0-306-47000-4_61, pp. 314-318.
Jeon et al., "Design of an on-interposer passive equalizer for high bandwidth memory (HBM) with 30Gbps data transmission," Electronic Components and Technology Conference (ECTC), 2016 IEEE 66th, Aug. 18, 2016.
Ker, Ming-Dou et al., "Fully process-compatible layout design on bond pad to improve wire bond reliability in CMOS lcs," IEEE Transactions on Components and Packaging Technologies, Jun. 2002, vol. 25, No. 2, pp. 309-316.
Kim et al., "A wideband on-interposer passive equalizer for chip-to-chip 30-GB/s serial data transmission," IEEE Transactions on Components, Packaging and Manufacturing Technology, Jan. 2015, vol. 5, Issued 1, pp. 28-39.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," Journal of Vacuum Science and Technology, Mar./Apr. 2003, vol. 21, No. 2, pp. 449-453.
Kim et al., "Wafer-Scale Surface Activated Bonding of Cuu-Cu, Cu—Si, and Cu—SiO2 at Low Temperature", Proceeding of the Electochemical Socitey, 2003, vol. 19, pp. 239-247.
Lee, H. et al., "Signal integrity of bump-less high-speed through silicon via channel for terabyte/s bandwidth 2.5D IC," 2016 IEEE 66th Electronic Components and Technology Conference, Aug. 18, 2016.
Matsuzawa et al., "Room-temperature interconnection of electro-electroplated Au microbump by means of surface activated bonding method," Electornic Components and Technology Confererence, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 12 pages.
Nakanishi H. et al., "Studies on Si02—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, and Figures 1(a)-1(1), 7 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issued 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatruent on the Si/Si bonding behaviouir," Electochemical Society Proceedings, 1998, vol. 97-36, pp. 437-444.
Roberds et al., "Low temperature, in situ, plasma activated wafer bonding." Electochemical Society Proceedings, 1997, vol. 97-36, pp. 437-444.
Shigetou et al., "Room-temperature direct bonding of CMP-Cu film for burnpless interconnection," Electronic Components and Technology Corifererence, 51st Proceedings, 2001, IEEE, pp. 755-760.
Shigetou et al., "Room temperature bonding of ultra-fine pitch and low-profiled Cu electrodes for bump-less interconnect," 2003 Electronic Components and Technology Conference, pp. 848-852.
Shingo et al, "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga et al., "Surface activated bonding for new flip chip and bumpless interconnect systems," Electronic Components aud Technology Conference, 2002, IEEE, pp. 105-111.
Suga, "Ceramic Microstructures: Contol at the Atomic Level", Recent Progress in Surface Activated Bonding, Springer, 1998, pp. 385-389.
Suga T., "Room-temperature bonding on metals and ceramics," Proceedingsof the Second International Symposium on Semiconductor Wafer Bonding: Science, Technology and Applications, the Electrochemical Society Proceedings, vol. 93-29 (1993), pp. 71-80.
Suga T., "Feasibility of surface activated bonding for ultra-fine pitch interconnection—A new concept of bump-less direct bonding for system level packaging," the University of Tokyo, Research Center for Science and Technology, 2000 Electronic Components and Technology Conference, 2000 IEEE, pp. 702-705.
Suga, "UHV room temperature joining by the surface activated bonding method," Advances in science and technology, Techna, Faenza, Italie, 1999, C1079-1089 (Abstract).
Takagi et al, "Wafer-scale room-temperature bonding between silicon and ceramic wafers by means of argon-beam surface activation," Micro Electro Mechanical Systems, 2001, MEMS 2001, the 14th IEEE International Conference, Jan. 25, 2001, IEEE, pp. 60-63.
Takagi et al., "Room temperature silicon wafer direct bonding in vacuum by Ar beam irradiation," MicroElectro Mehcanical Systems. MEMS '97 Proceedings, 1997, IEEE, pp. 191-196.
Takagi et al., "Effect of surface roughness on room-temperature wafer bonding by Ar Beam surface activation," Japanese Journal of Applied Physics, 1998, vol. 37, Part 1, No. 1, pp. 4197.
Takagi et al., "Low-temperature direct bonding of silicon and silicon dioxide by the surface activation method", Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation", Applied Physicals Letters, vol. 74, No. 16, Apr. 16, 1999, pp. 2387-2389.
Takagi et al., "Room-temperature wafer bonding of Si to LiNb03, LiTa03 and Gd3Ga5012 by Arbearn surface activation," Journal of Micromechanics and Microengineering, 2001, vol. 11, No. 4, pp. 348.

(56) References Cited

OTHER PUBLICATIONS

Takagi et al., "Surfaced activated bonding of silicon wafers at room temperature", Appl. Phys. Lett. 68, Apr. 15, 1996, pp. 2222-2224.

Takagi et al., "Wafer-scale spontaneous bonding of silicon wafers by argon-beam surface activation at room temperature", Sensors and Actuators A: Physical, Jun. 15, 2003, vol. 105, Issue I. pp. 98-102.

Takagi et al., "Room-Temperature Wafer Bonding of Silicon and Lithium Niobate by Means of Argon-Beam Surface Activation", Integrated Ferroelectrics: an Internation Journal, 2002, vol. 50, Issue 1, pp. 53-59.

Tong et al., "Low temperature wafer direct bonding", Journal of Microelectomechanical systems, Mar. 1994, vol. 3, No. 1, pp. 29-35.

Topol et al., "Enabling technologies for wafer-level bonding of 3D MEMS and integrated circuit structures," 2004 Electronics Components and Technology Conference, 2004 IEEE, pp. 931-938.

Wang et al., "Reliability and microstructure of Au—Al and Au—Cu direct bonding fabricated by the Surface Activated Bonding," Electronic Components and Technology Conference, 2002, IEEE, pp. 915-919.

Wang et al., "Reliability of Au bump—Cu direct interconnections fabricated by means of surface activated bonding method", Microelectronics Reliability, May 2003, vol. 43, Issue 5, pp. 751-756.

Weldon et al., "Physics and chemistry of silicon wafer bonding investigated by infrared absorption spectroscopy", Journal of Vacuum Science & Technology, Jul./Aug. 1996, vol. 14, No. 4, pp. 3095-3106.

Westphal et al., "Dielectric constant and loss data", Air Force Materials Laborat01y, Apr. 1972.

Xu et al., "New Au—Al interconnect technology and its reliability by surface activated bonding," Electronic Packaging Technology Proceedings, Oct. 28-30, 2003, Shanghai, China, pp. 479-483.

\* cited by examiner

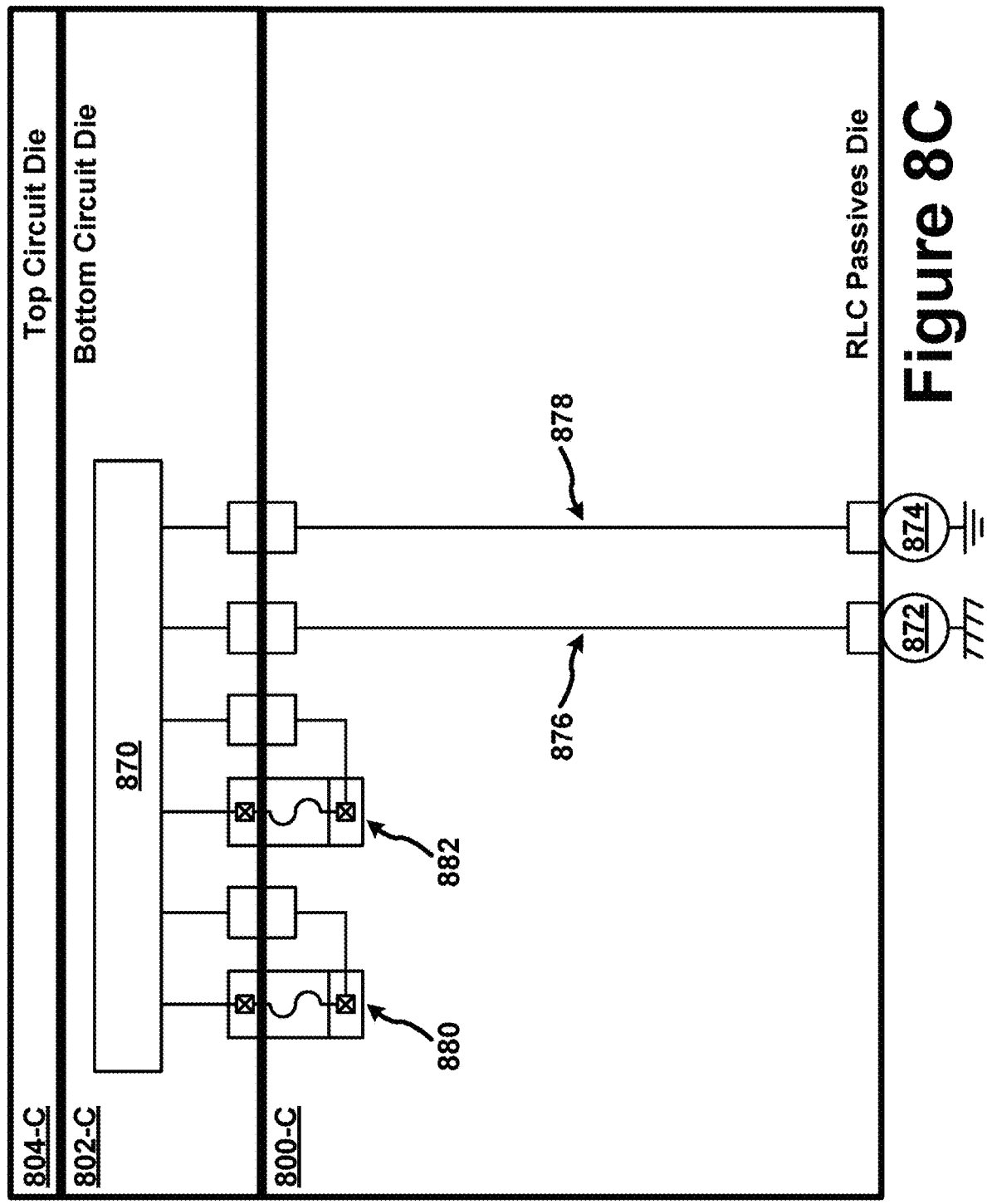

INTEGRATED VOLTAGE REGULATOR AND PASSIVE COMPONENTS

RELATED APPLICATIONS

This application is a continuation of U.S. patent application Ser. No. 16/397,202, filed Apr. 29, 2019, now U.S. Pat. No. 11,515,291, which claims priority to U.S. Provisional Patent Application No. 62/723,897 filed on Aug. 28, 2018. The content of each of these applications is incorporated by reference herein in its entirety.

FIELD OF THE INVENTION

The invention pertains to voltage regulation in electronic systems, and more specifically to integrating voltage regulators and associated passive components into semiconductor packages with at least a portion of the circuits whose voltage(s) they are regulating.

BACKGROUND OF THE INVENTION

FIG. 1A illustrates a block diagram of a portion of a conventional system 100 which is suitable for use in, for example, a device such as a cellphone or computer. System 100 may comprise printed circuit board (PCB) 110. Mounted on PCB 110 are components which may include a data processing integrated circuit (DPIC) 112 which may be, for example, a central processing unit (CPU), a microprocessor unit (MPU), a microcontroller unit (MCU), an Applications Processor (AP), a Digital Signal Processor (DSP), a System-on-a-Chip (SOC), an Application Specific Integrated Circuit (ASIC), or some other type of integrated circuit. Also mounted on PCB 110 may be an optional battery 114, an external connector 116, one or more RLC passive components 118, and a Power Management Integrated Circuit (PMIC) 120.

Active components (as opposed to passive components) are considered to be circuits or circuit elements that provide electrical gain and/or switching. Examples of active components are, for example, transistors, amplifiers, oscillators, pass transistors, transmission gates, etc.

Passive components are circuits or circuit elements that do not provide electrical gain. The common acronym RLC stands for Resistors, Inductors and Capacitors, all of which are examples of passive components. (Since "I" is by convention an abbreviation for current in electrical engineering, the letter "L" is by convention used as an abbreviation for inductance, hence "RLC" instead of "RIC.") RLC may be, and herein is, used as a generic stand-in for one or more passive components regardless what mix of components are actually present. Other examples of passive components may include, for example, fuses or antifuses, resistors through-silicon vias (TSVs), etc., and may be included along with resistors, inductors, and capacitors in any combination as part of generic phrases like, for example, "RLC passive components" or "RLC passives" or "RLC components" or simply "RLC."

PMIC 120 may be coupled to DPIC 112, the optional battery 114, the external connector 116, and the RLC passives 118. External connector 116 may be one of many types known in the art. It may supply one or more power and ground connections to other components and/or to PMIC 120 which in turn may regulate or supply power to some or all of the other components on PCB 110.

The RLC passive components 118 may perform a variety of different functions for system 100. They may, for example, provide diodes to protect PCB 110 from power surges, hot insertions, and electrostatic discharge (ESD) events related to the external connector 116. They may also provide decoupling capacitors for DPIC 112, PMIC 120, and other chips in the system not shown in FIG. 1A, as well as other components needed for other functions in system 100 (not shown).

PMIC 120 may have a variety of circuits providing different sorts of power control to different parts of the system. For example, battery tender circuit 122 may control the battery charging, discharging, leakage, and maintenance as is known in the art in systems where battery 114 is present.

Also present may be any of a variety of power supplies and/or regulators known in the art like, for example, switching supply 124 and Low Drop Out regulators (LDOs) 126 and 128. Switching supply 124 may be any of a number of types known in the art like, for example, a buck converter, a boost converter, a switched capacitor converter, etc. These circuits often require external capacitors and inductors with values larger than may be practical to implement as a portion of PMIC 120. They may also generate significant noise so care must be taken in their design and use.

Low Drop Out (LDO) regulators like 126 and 128 are known in the art. They are a type of linear regulator that provides a small step down from a power supply voltage to a regulated lower voltage. They may also be present in PMIC 120 to provide different voltages to DPIC 112 and/or other integrated circuits in system 100 not shown in FIG. 1A.

FIG. 1B illustrates a physical cross section of a portion of system 100. It is intended for illustrative purposes and is not drawn to scale. Present in the figure are PCB 110, PMIC 120, and a package 130, the latter further comprising data processing integrated circuit 112 and details of other physical elements.

Package 130 may comprise DPIC 112 which may be bonded to a package substrate 132 with solder bumps 138. Data processing integrated circuit 112 may be surrounded by die seal 134 to protect it from physical, chemical and/or electrical damage, but this may not be the case in some applications. In some technologies die seal 134 may not be present at all like, for example, in a die scale package. In other technologies, die seal 134 may be present as a layer between DPIC 112 and the package substrate 132 (and is known as underfill). Package 130 itself may be bonded to PCB 110 by means of solder balls 136 coupled to the package substrate 132.

PMIC 120 is also shown in the figure, but without any internal package detail. It may be bonded to PCB 110 by solder bumps 140, and coupled to package 130 though metal traces 142 present in PCB 110, though many other configurations are possible.

It is highly desirable for the circuitry comprising PMIC 120 and RLC passives 118 (not shown in FIG. 1B) to be located in the same package as DPIC 112 to improve electrical performance and save area on PCB 110.

DESCRIPTION OF THE DRAWINGS

FIG. 8C is not drawn to scale and illustrates a cross section of an RLC passives die 800-C according to an embodiment of the present invention.

DETAILED DESCRIPTION OF THE INVENTION

Figure 1A:
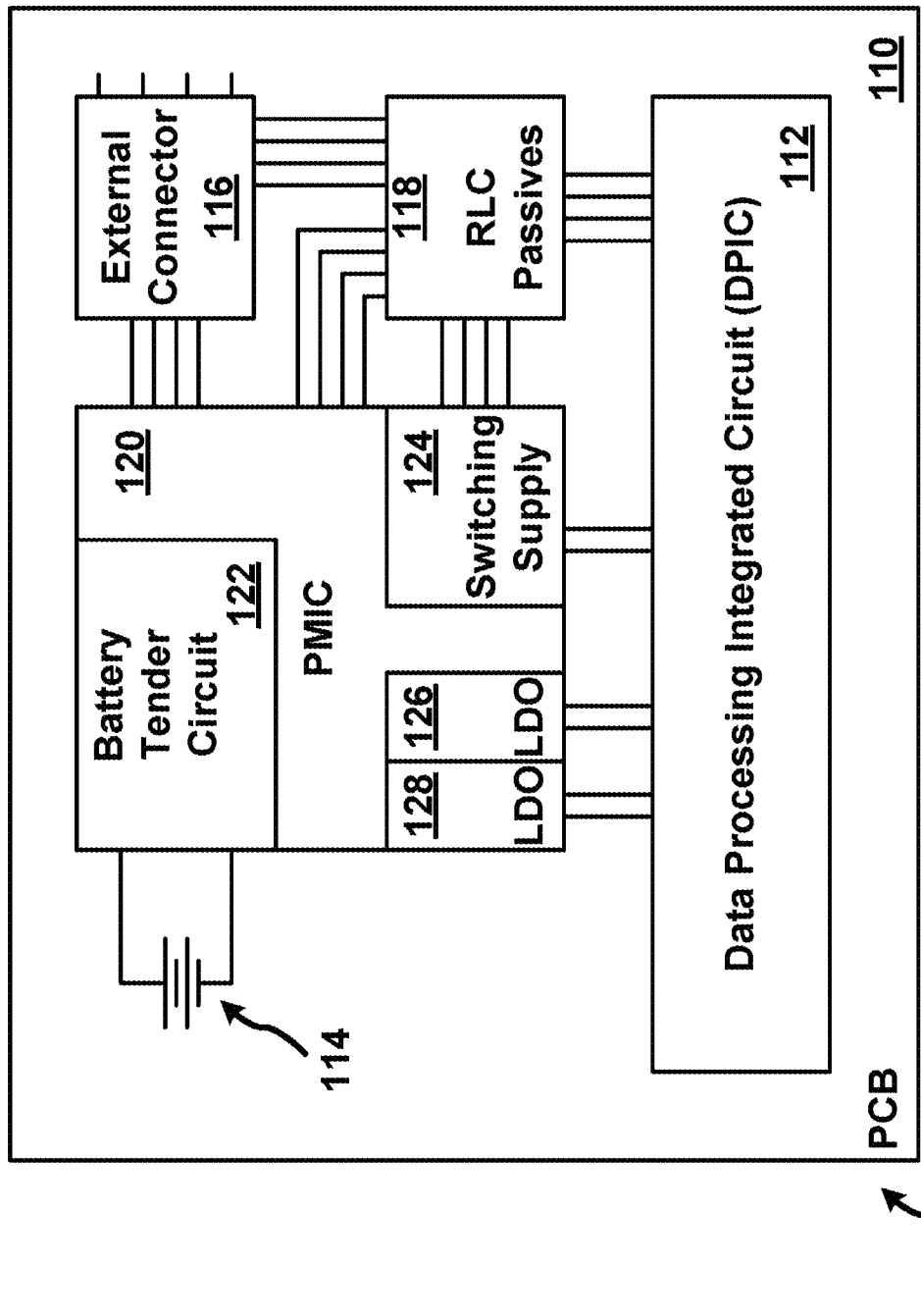
FIG. 1A illustrates a block diagram of portion of a conventional system 100.
Figure 1B:
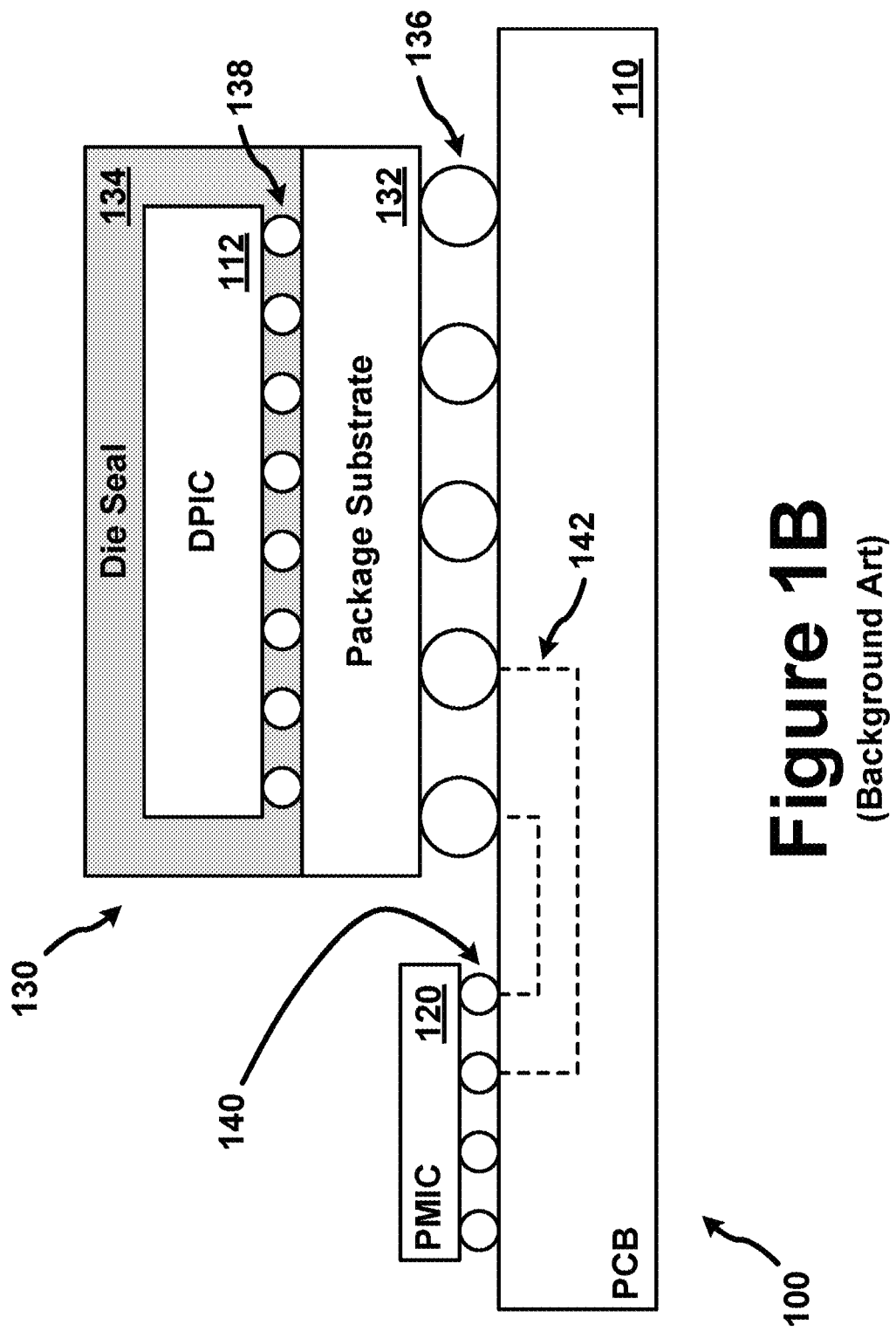
FIG. 1B is not drawn to scale and illustrates a cross section of a portion of the conventional system 100.

Those of ordinary skill in the art will realize that the following figures and descriptions of exemplary embodiments and methods of the present invention are illustrative only and not in any way limiting. Other embodiments will readily suggest themselves to such skilled persons after reviewing this disclosure.

Reference numbers are generally keyed to the figure in which they first appear. For example, a reference number in the range 700-799 will typically appear first in FIG. 7. Reference numbers in the 400-499 range will typically appear first in one of the FIG. 4A, 4B, 4C, or 4D. Identical reference numbers in different figures indicate identical, similar, or analogous structures or features. In many figures, multiple instances of a particular element or feature may be shown, but only a single example may be given a reference numeral to avoid overcomplicating the drawings.

Figure 2A:
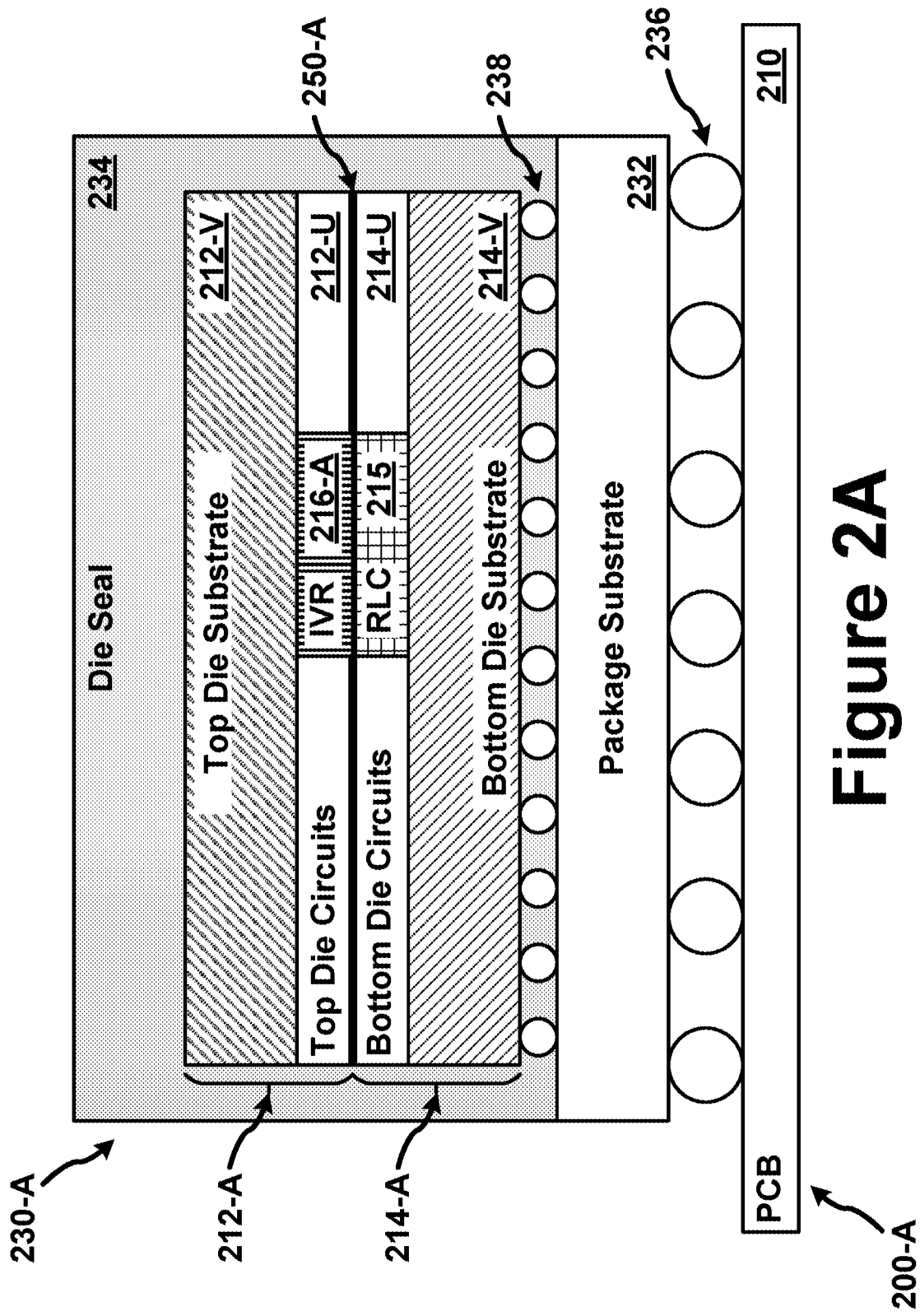
FIG. 2A is not drawn to scale and illustrates a portion of a system 200-A with details of a cross section of a package 230-A according to an embodiment of the present invention.

FIG. 2A is not drawn to scale and illustrates a portion of a system 200-A with details of a cross section of a package 230-A according to an embodiment of the present invention. System 200-A comprises PCB 210 with package 230-A mounted onto it by means of solder balls 236. Package 230-A further comprises top integrated circuit 212-A and bottom integrated circuit 214-A. Top integrated circuit 212-A comprises a circuit portion 212-U and a substrate portion 212-V. Similarly, bottom integrated circuit 214-A comprises a circuit portion 214-U and a substrate portion 214-V.

Top integrated circuit 212-A may be both physically and electrically coupled to bottom integrated circuit 214-A at interface 250-A using, for example, a die-to-die or wafer-to-wafer bonding technology. Dies or wafers may be bonded in a stacked arrangement using various bonding techniques like, for example, DBI®, a hybrid direct bonding technology that allows semiconductor wafers or dies to be bonded with exceptionally fine pitch 3D electrical interconnect, available from Invensas Bonding Technologies, Inc. (formerly Ziptronix, Inc.), an Xperi company (see for example, U.S. Pat. Nos. 6,864,585 and 7,485,968, which are incorporated herein in their entirety). Thus a high density of power and signal interconnections may be available between integrated circuits 212-A and 214-A.

The two integrated circuits 212-A and 214-A bonded together at interface 250-A may be mounted on package substrate 232 by solder bumps 238, and may be surrounded by die seal 234 to protect them from physical, chemical, and electrical damage. Coupling between the circuit portions 212-U and 214-U (of the bonded integrated circuits 212-A and 214-A, respectively) and the solder bumps 238 may be made by, for example, through-silicon vias (TSVs) passing through integrated circuit 214-A (not shown in FIG. 2A). While this particular packaging configuration and technology has been chosen for ease of explanation of exemplary embodiments, persons skilled in the art will realize that there are many other packaging configurations and technologies that may be used within the scope of the present invention.

The circuit portion 212-U further comprises an integrated voltage regulator (IVR) circuit 216-A, while circuit portion 214-U further comprises integrated RLC passive components 215. IVR circuit 216-A may comprise some, all, or different regulatory circuitry, partially or completely replacing similar circuits like, for example, portions of a chip like, for example, PMIC 120 in FIG. 1A. Similarly, RLC 215 may comprise some, all, or different components, partially or completely replacing similar circuit components like, for example, the ones comprising RLC passive components 118 in FIG. 1A.

Integrated circuits 212-A and 214-A may be manufactured using different semiconductor fabrication processes. For example, integrated circuit 212-A might be manufactured in a process more favorable for producing circuits like those found, for example, in data processing integrated circuit 112 and/or PMIC 120 in FIG. 1A, while integrated circuit 214-A might be fabricated in a process more suitable for producing RLC passives with much larger component values than could normally be produced on a process more suitable for manufacturing integrated circuits like 212-A. This approach has the advantage over the background art of saving space on PCB 210 as well better electrical performance by placing IVR 216-A and RLC 215 closer to each other as well as to the other circuits they might be coupled to.

Figure 2B:
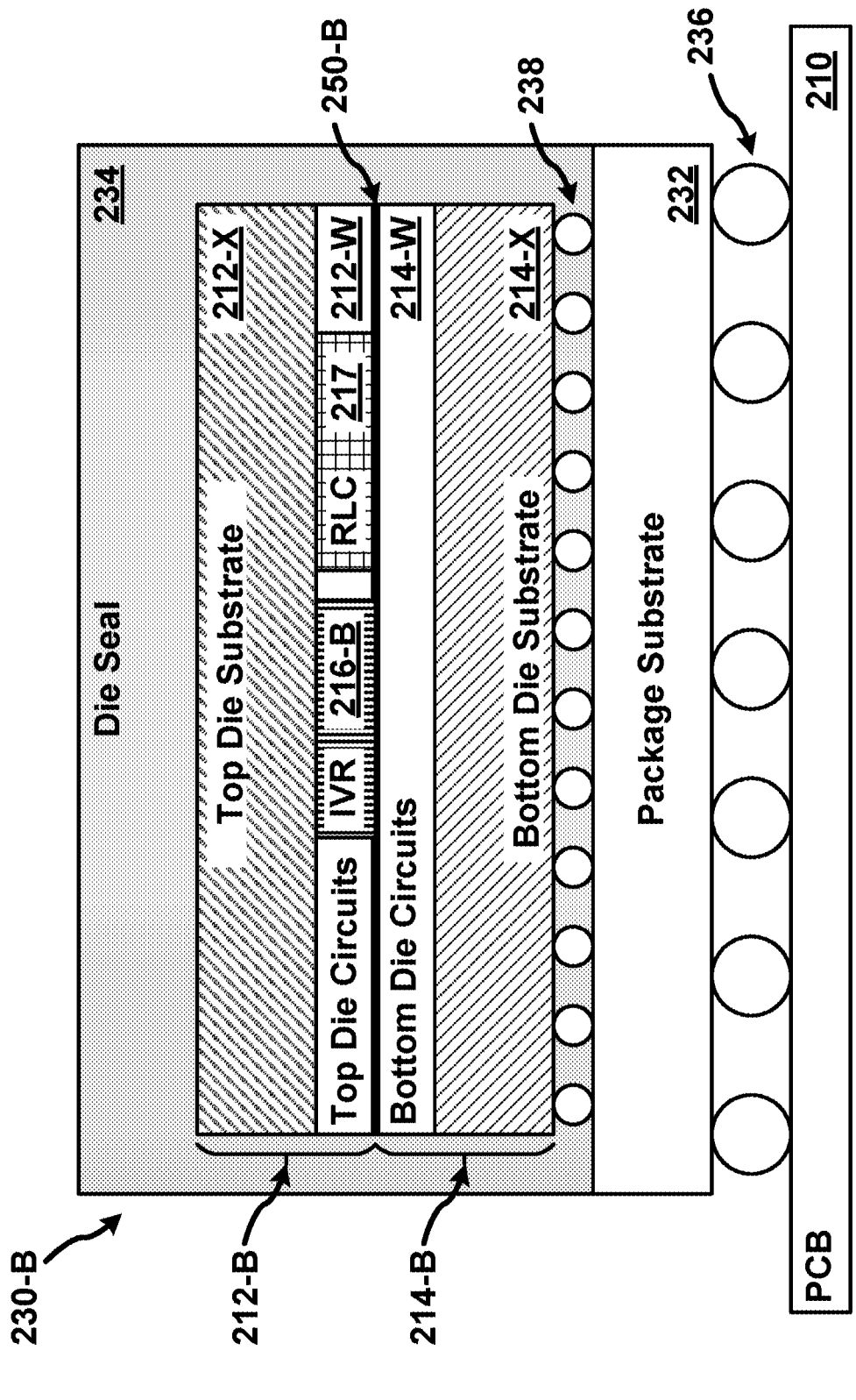
FIG. 2B is not drawn to scale and illustrates a portion of a system 200-B with details of a cross section of a package 230-B according to an embodiment of the present invention.

FIG. 2B is not drawn to scale and illustrates a portion of a system 200-B with details of a cross section of a package 230-B according to an embodiment of the present invention. System 200-B comprises PCB 210 with package 230-B mounted onto it by means of solder balls 236. Package 230-B further comprises top integrated circuit 212-B and bottom integrated circuit 214-B. Top integrated circuit 212-B comprises a circuit portion 212-W and a substrate portion 212-X. Similarly, bottom integrated circuit 214-B comprises a circuit portion 214-W and a substrate portion 214-X. Top integrated circuit 212-B may be both physically and electrically coupled to bottom integrated circuit 214-B at interface 250-B using, for example, a die-to-die or wafer-to-wafer bonding technology like, for example, DBI® a hybrid direct bonding technology available from Invensas Bonding Technologies, Inc.

The two integrated circuits 212-B and 214-B bonded together at interface 250-B may be mounted on package substrate 232 by solder bumps 238, and may be surrounded by die seal 234 to protect them from physical, chemical, and electrical damage. Coupling between the circuit portions 212-W and 214-W (of the bonded integrated circuits 212-B and 214-B, respectively) and the solder bumps 238 may be made by, for example, through-silicon vias (TSVs) passing through integrated circuit 214-B (not shown in FIG. 2B). While this particular packaging configuration and technology has been chosen for ease of explanation of exemplary embodiments, persons skilled in the art will realize that there are many other packaging configurations and technologies that may be used within the scope of the present invention.

The circuit portion 212-W further comprises an integrated voltage regulator (IVR) circuit 216-B and RLC passive components 217. IVR circuit 216-B comprises some, all, or different regulatory circuitry, partially or completely replacing similar circuits like, for example, those comprising portions of a chip like, for example, PMIC 120 in FIG. 1A. Similarly, RLC 217 may comprise some, all, or different components, partially or completely replacing similar circuit components like, for example, the ones comprising RLC passive components 118 in FIG. 1A.

Integrated circuits 212-B and 214-B may be manufactured using different semiconductor fabrication processes. For example, integrated circuit 212-B might be manufactured in a process more favorable for producing both analog circuits like those found, for example, in PMIC 120 in FIG. 1A, as well as for RLC passives like those found, for example in RLC 116 in FIG. 1A. Integrated circuit 214-B might be fabricated in a process more suitable for producing data processing integrated circuits like, for example, DPIC 112 in FIG. 1A. This approach has the advantage over the background art of saving space on PCB 210 as well better electrical performance by placing IVR 216-B and RLC 217 closer to each other as well as to the other circuits they might be coupled to.

Figure 2C:
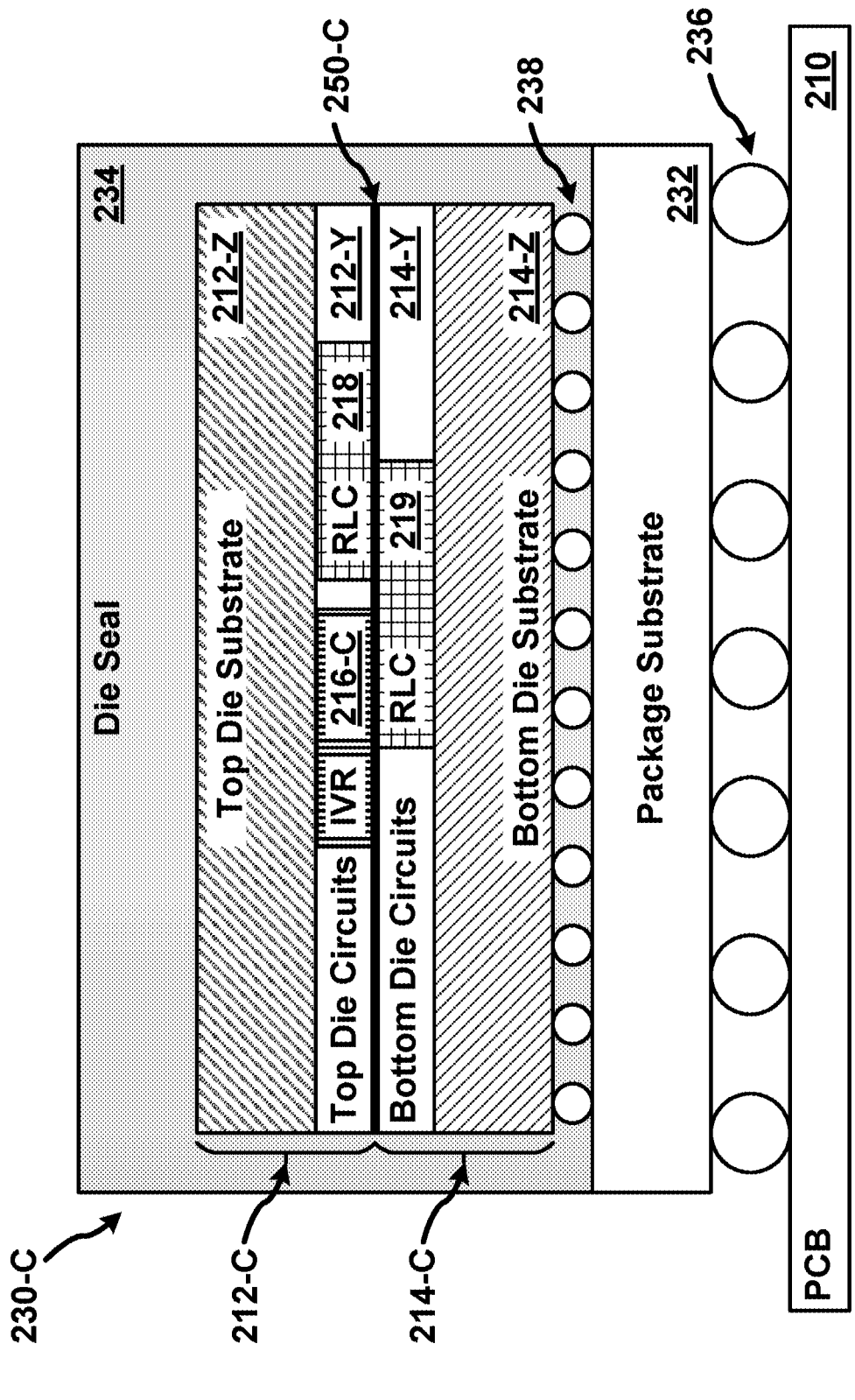
FIG. 2C is not drawn to scale and illustrates a portion of a system 200-C with details of a cross section of a package 230-C according to an embodiment of the present invention.

FIG. 2C is not drawn to scale and illustrates a portion of a system 200-C with details of a cross section of a package 230-C, according to an embodiment of the present invention. System 200-C comprises PCB 210 with package 230-C mounted onto it by means of solder balls 236. Package 230-C further comprises top integrated circuit 212-C and bottom integrated circuit 214-C. Top integrated circuit 212-C comprises a circuit portion 212-Y and a substrate portion 212-Z. Similarly, bottom integrated circuit 214-C comprises a circuit portion 214-Y and a substrate portion 214-Z. Top integrated circuit 212-C may be both physically and electrically coupled to bottom integrated circuit 214-C at interface 250-C like, for example, DBI®.

The two integrated circuits 212-C and 214-C bonded together at interface 250-C may be mounted on package substrate 232 by solder bumps 238, and may be surrounded by die seal 234 to protect them from physical, chemical, and electrical damage. Coupling between the circuit portions 212-Y and 214-Y (of the bonded integrated circuits 212-C and 214-C, respectively) and the solder bumps 238 may be made by, for example, through-silicon vias (TSVs) passing through integrated circuit 214-C (not shown in FIG. 2C). While this particular packaging configuration and technology has been chosen for ease of explanation of exemplary embodiments, persons skilled in the art will realize that there are many other packaging configurations and technologies that may be used within the scope of the present invention.

The circuit portion 212-Y further comprises an integrated voltage regulator (IVR) circuit 216-C and RLC passive components 218, while the circuit portion 214-Y further comprises RLC passive components 219. IVR circuit 216-C comprises some, all, or different regulatory circuitry, partially or completely replacing similar circuits like, for example, those comprising portions of a chip like PMIC 120 in FIG. 1A. Similarly, RLC 218 and RLC 219 may comprise some, all, or different components, partially or completely replacing similar circuit components like, for example, the ones comprising RLC passive components 118 in FIG. 1A.

Integrated circuits 212-C and 214-C may be manufactured using different semiconductor fabrication processes. For example, integrated circuit 212-C might be manufactured in a process more favorable for producing both analog circuits like those found, for example, in PMIC 120 in FIG. 1A, as well as for RLC passives like those found, for example in RLC 118 in FIG. 1A, with much larger component values, while integrated circuit 214-C might be fabricated in a process more suitable for producing data processing integrated circuits like, for example, DPIC 112 in FIG. 1A.

In this configuration, individual passive components may be formed in two parts via the connections at the interface 250-C between RLC 218 and RLC 219. This approach has the advantage over the background art of saving space on PCB 210 as well better electrical performance by placing IVR 216-C and RLCs 218 and 219 closer to the circuits they are coupled to. In addition, the interface 250-C can be made extremely thin to enhance the electric and/or magnetic coupling to more efficiently make passive components formed in two parts.

Figure 3A:
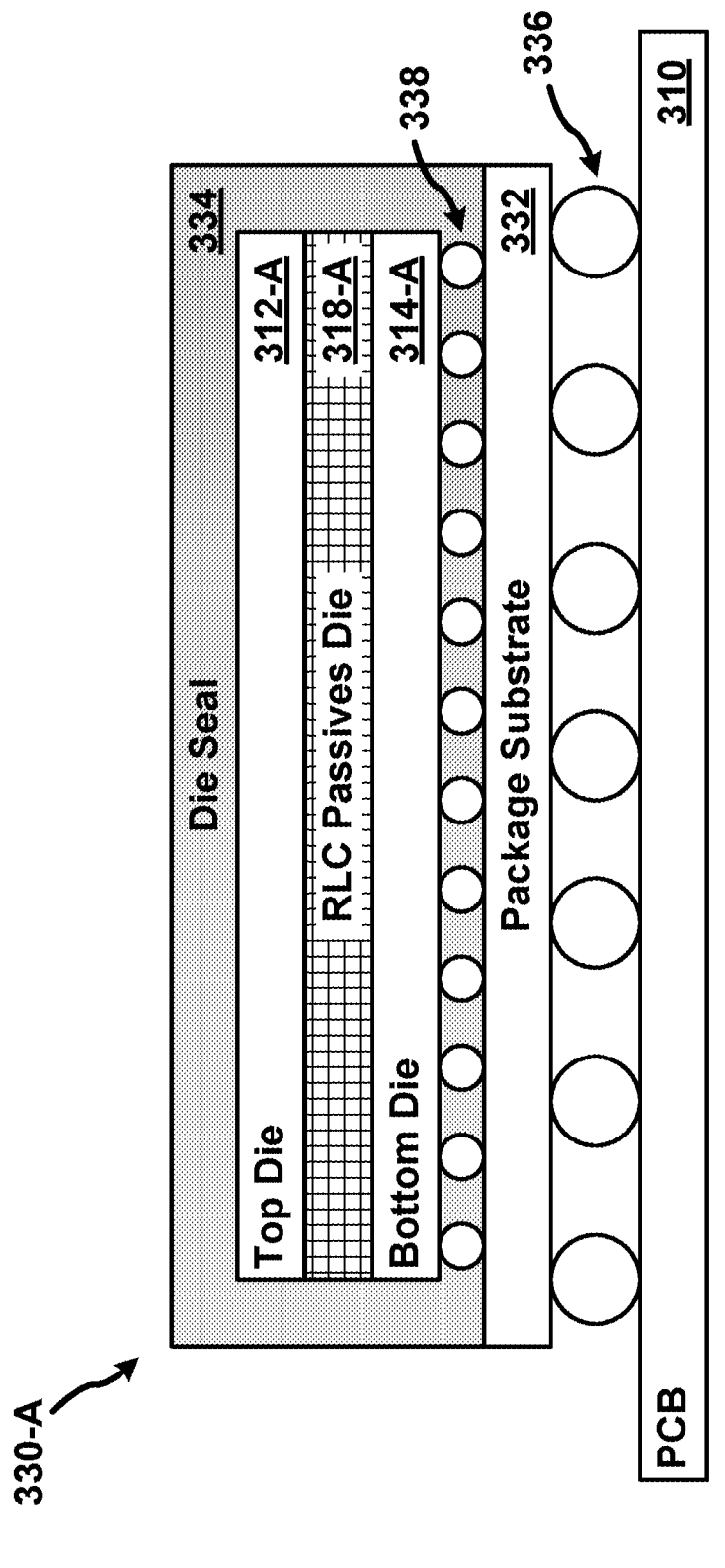
FIG. 3A is not drawn to scale and illustrates a portion of a system 300-A with details of a cross section of a package 330-A according to an embodiment of the present invention.

FIG. 3A is not drawn to scale and illustrates a portion of a system 300-A with details of a cross section of a package 330-A according to an embodiment of the present invention. System 300-A comprises PCB 310 with package 330-A mounted onto it by means of solder balls 336. Package 330-A further comprises top integrated circuit (IC) 312-A, RLC passives die 318-A, and bottom integrated circuit die 314-A. Top IC 312-A may be physically and electrically coupled to RLC 318-A using, for example, a die-to-die or wafer-to-wafer bonding technology like, for example, DBI® a hybrid direct bonding technology available from Invensas Bonding Technologies, Inc. Similarly, RLC 318-A may also be physically and electrically coupled to IC 314-A using, for example, DBI®. IC 312-A, RLC 318-A, and IC 314-A may be mounted to package substrate 332 by solder bumps 338. Further, IC 312-A, RLC 318-A, and IC 314-A may be electrically coupled together and to the solder bumps 338 with TSVs passing through RLC 318-A and IC 314-A (not shown in FIG. 3A).

Top IC 312-A, RLC 318-A, and bottom IC 314-A may be manufactured using different semiconductor fabrication processes appropriate to the circuitry therein. For example, IC 312-A may be manufactured in a process tuned to produce ICs like, for example, PMIC 120 in FIG. 1A, while RLC 318-A may be manufactured in a process tuned to produce passive components, and IC 314-A may be manufactured in a process tuned to produce ICs like, for example, DPIC 112 in FIG. 1A. Persons skilled in the art will appreciate many other configurations and combinations are possible as a matter of design choice and fall within the scope of the present invention. For example, the side with the circuitry of each die may be either be facing towards (down) or away from (up) the package substrate 332. If the active circuitry of top IC 312-A faces away from package substrate 332, TSVs through IC 312-A may also be needed (not shown in FIG. 3A).

This approach improves over the background art because in many embodiments it allows a system like system 100 in FIG. 1A to incorporate DPIC 112, RLC passives 118, and PMIC 120 into a single package improving electrical performance and saving valuable space on PCB 110.

Figure 3B:
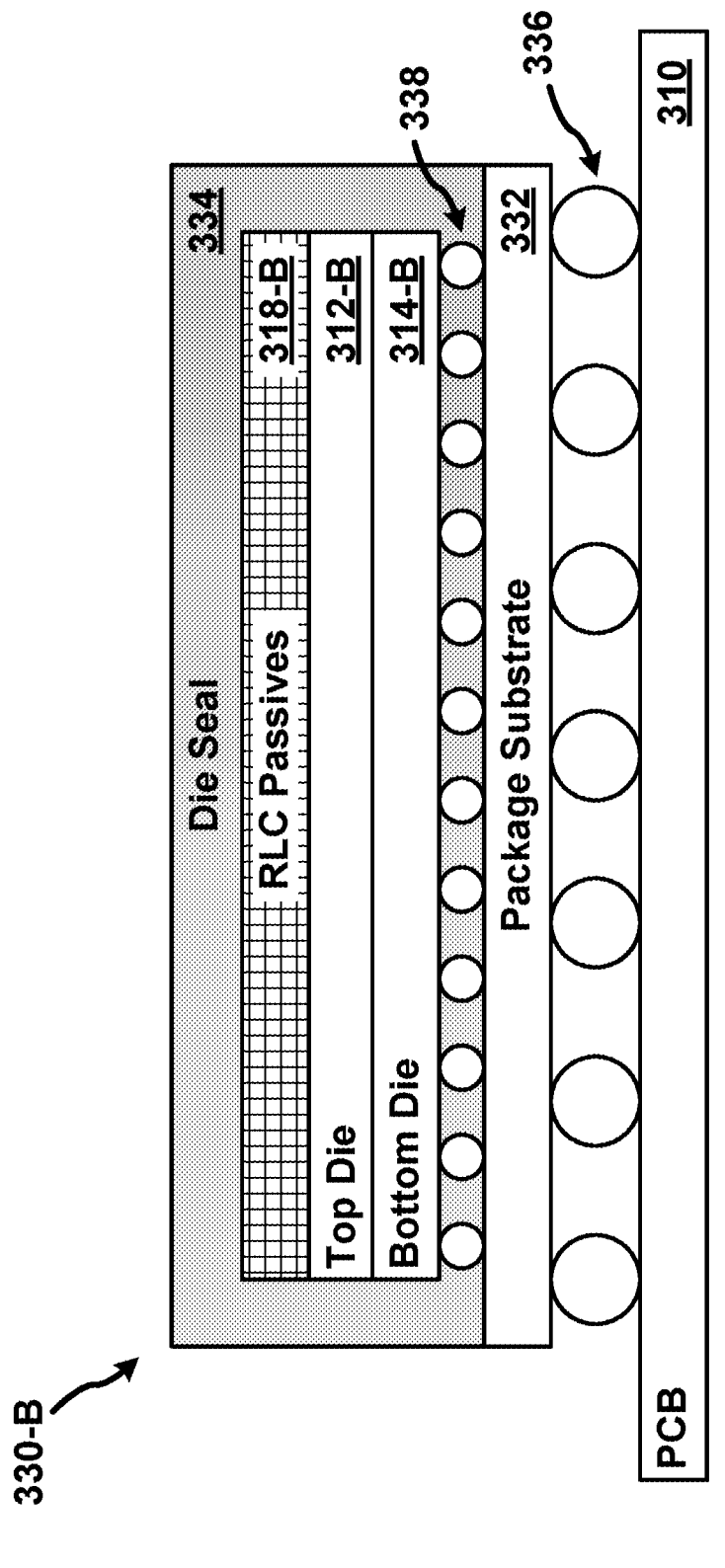
FIG. 3B is not drawn to scale and illustrates a portion of a system 300-B with details of a cross section of a package 330-B according to an embodiment of the present invention.

FIG. 3B is not drawn to scale and illustrates a portion of a system 300-B with details of a cross section of a package 330-B according to an embodiment of the present invention. System 300-B comprises PCB 310 with package 330-B mounted onto it by means of solder balls 336. Package 330-B further comprises RLC passives die 318-B, top integrated circuit (IC) die 312-B, and bottom integrated circuit die 314-B. RLC 318-B may be physically and electrically coupled to IC 312-B using, for example, a die-to-die or wafer-to-wafer bonding technology like, for example, DBI®. Similarly, IC 312-B may also be physically and electrically coupled to IC 314-B like, for example, a die-to-die or wafer-to-wafer bonding technology like, for example, DBI®. RLC 318-B, IC 312-B, and IC 314-B may be mounted to package substrate 332 by solder bumps 338. Further, RLC 318-A, IC 312-A, and IC 314-A may be electrically coupled together and to the solder bumps 338 with TSVs passing through IC 312-B and IC 314-B (not shown in FIG. 3B).

RLC 318-B, top IC 312-B, and bottom IC 314-B may be manufactured using different semiconductor fabrication processes appropriate to the circuitry therein. For example, RLC 318-B may be manufactured in a process tuned to produce passive components, while IC 312-B may be manufactured in a process tuned to produce ICs like, for example, PMIC 120 in FIG. 1A, and IC 314-B may be manufactured in a process tuned to produce ICs like, for example, data processing integrated circuit 112 in FIG. 1A. Persons skilled in the art will appreciate many other configurations and combinations are possible as a matter of design choice and fall within the scope of the present invention. For example, the side with the circuitry of each die may be either be facing towards (down) or away from (up) package substrate 332. Depending on the design of its components and circuitry, if RLC 318-B faces away from package substrate 332, TSVs through RLC 318-C may also be needed (not shown in FIG. 3B).

This approach improves over the background art because in many embodiments it allows a system like system 100 in FIG. 1A to incorporate DPIC 112, RLC passives 118, and PMIC 120 into a single package improving electrical performance and saving valuable space on PCB 110.

Figure 3C:
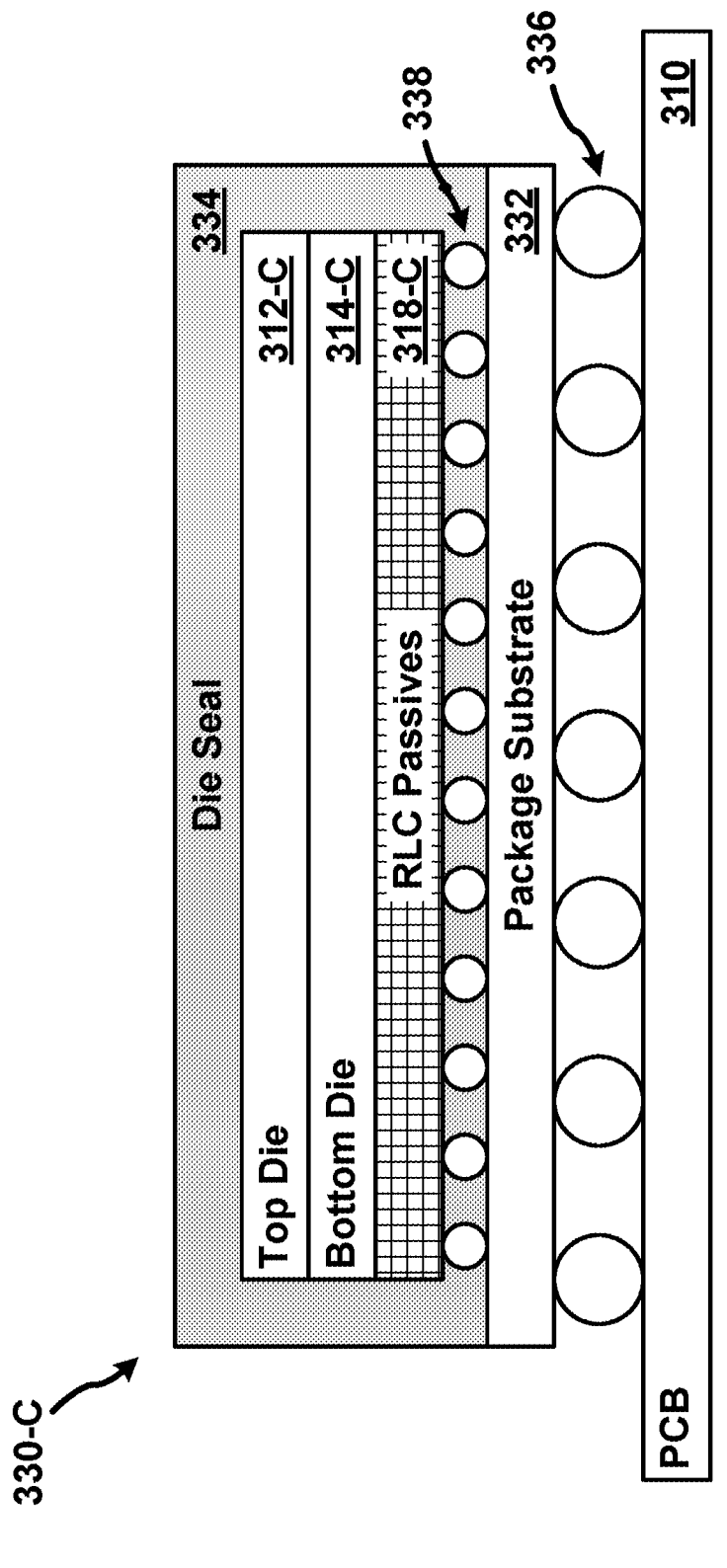
FIG. 3C is not drawn to scale and illustrates a portion of a system 300-C with details of a cross section of a package 330-C according to an embodiment of the present invention.

FIG. 3C is not drawn to scale and illustrates a portion of a system 300-C with details of a cross section of a package 330-C according to an embodiment of the present invention. System 300-C comprises PCB 310 with package 330-C mounted onto it by means of solder balls 336. Package 330-C further comprises top integrated circuit (IC) 312-C, bottom integrated circuit die 314-C, and RLC passives die 318-C. IC 312-C may be physically and electrically coupled to IC 314-C using, for example, a die-to-die or wafer-to-wafer bonding technology like, for example, DBI®, a hybrid direct bonding technology available from Invensas Bonding Technologies, Inc. Similarly, IC 314-C may also be physically and electrically coupled to RLC 318-C using, for example, a die-to-die or wafer-to-wafer bonding technology like, for example, DBI®. IC 312-C, RLC 318-C, and IC 314-C may be mounted to package substrate 332 by solder bumps 338. Further, IC 312-C, IC 314-C, and RLC 318-C, may be electrically coupled together and to the solder bumps 338 with TSVs passing through IC 314-C and RLC 318-C (not shown in FIG. 3C).

Top IC 312-C, bottom IC 314-C, and RLC 318-C, may be manufactured using different semiconductor fabrication processes appropriate to the circuitry therein. For example, IC 312-C may be manufactured in a process tuned to produce ICs like, for example, data processing integrated circuit 112 in FIG. 1A, while IC 314-C may be manufactured in a process tuned to produce ICs like, for example, PMIC 120 in FIG. 1A, and RLC 318-C may be manufactured in a process tuned to produce passive components. Persons skilled in the art will appreciate many other configurations and combinations are possible and a matter of design choice and fall within the scope of the present invention. For example, the side with the circuitry of each die may be either be facing towards (down) or away from (up) package substrate 332. If the active circuitry of top IC 312-C faces away from package substrate 332, TSVs through IC 312-C may also be needed (not shown in FIG. 3C).

This approach improves over the background art because in many embodiments it allows a system like system 100 in FIG. 1A to incorporate DPIC 112, RLC passives 118, and PMIC 120 into a single package improving electrical performance and saving valuable space on PCB 110.

Figure 4A:
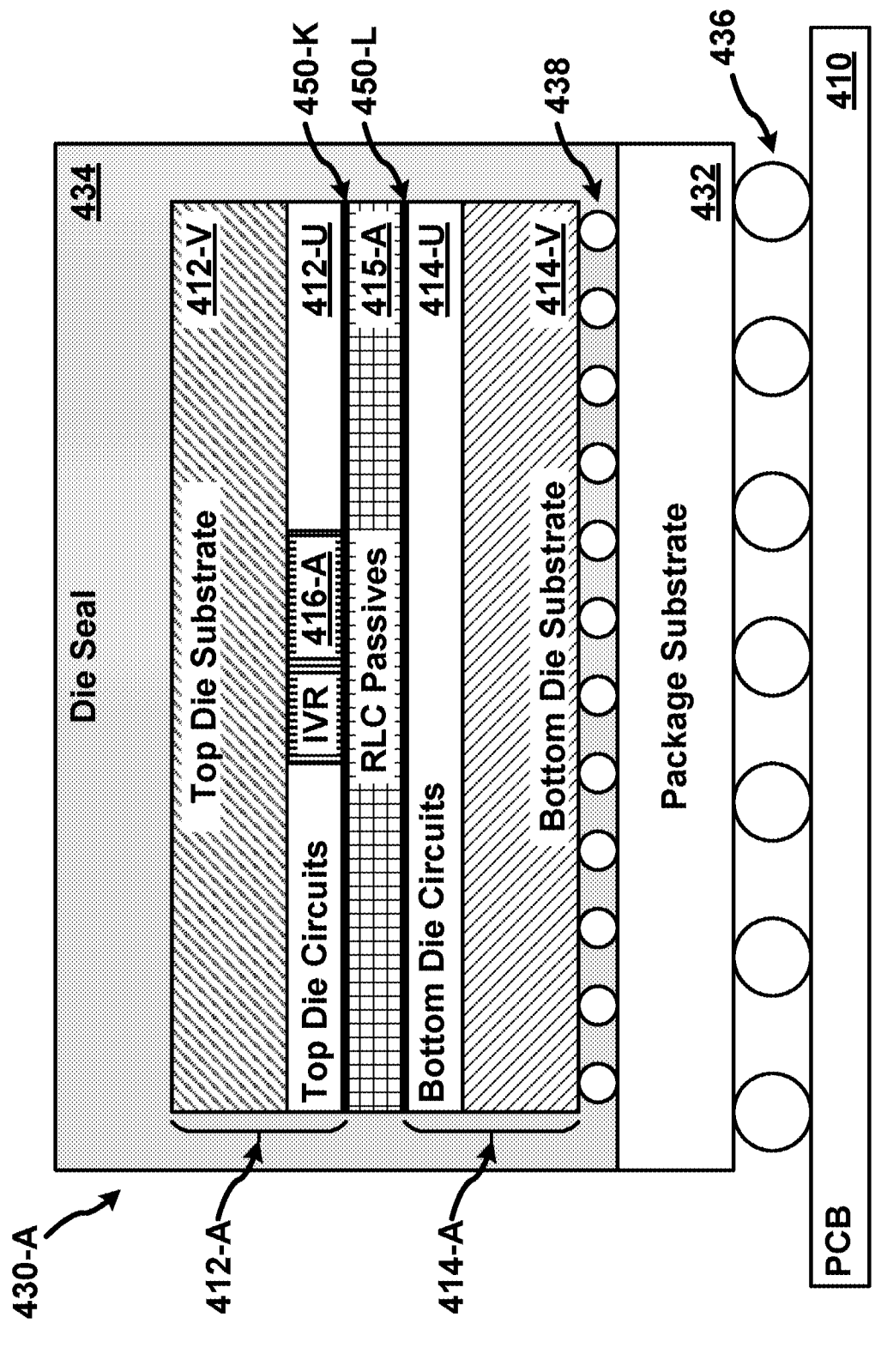
FIG. 4A is not drawn to scale and illustrates a portion of a system 400-A with details of a cross section of a package 430-A according to an embodiment of the present invention.

FIG. 4A is not drawn to scale and illustrates a portion of a system 400-A with details of a cross section of a package 430-A according to an embodiment of the present invention. System 400-A comprises PCB 410 with package 430-A mounted onto it by means of solder balls 436. Package 430-A further comprises top integrated circuit die 412-A, RLC passives die 415-A, bottom integrated circuit die 414-A, and die seal 434. Top integrated circuit 412-A comprises a circuit portion 412-U and a substrate portion 412-V. Similarly, bottom integrated circuit 414-A comprises a circuit portion 414-U and a substrate portion 414-V.

Top integrated circuit 412-A may be both physically and electrically coupled to RLC 415-A at interface 450-K using, for example, a die-to-die or wafer-to-wafer bonding technology like, for example, DBI® a hybrid direct bonding technology available from Invensas Bonding Technologies, Inc. Similarly, RLC 415-A may also be both physically and electrically coupled to bottom integrated circuit 414-A at interface 450-L using, for example, DBI®.

The circuit portion 412-U of top IC 412-A further comprises integrated voltage regulator (IVR) 416-A. This allows better electrical performance because of the proximity of IVR 416-A to a select portion of the components of RLC 415-A that are directly coupled between them at interface 450-K, while other passive components with less critical layout constraints may be placed elsewhere on RLC 415-A. Further, it allows IVR 416-A to be placed in a location that is optimal for the circuits it regulates power for in either IC 412-A or IC 414-A.

Figure 4B:
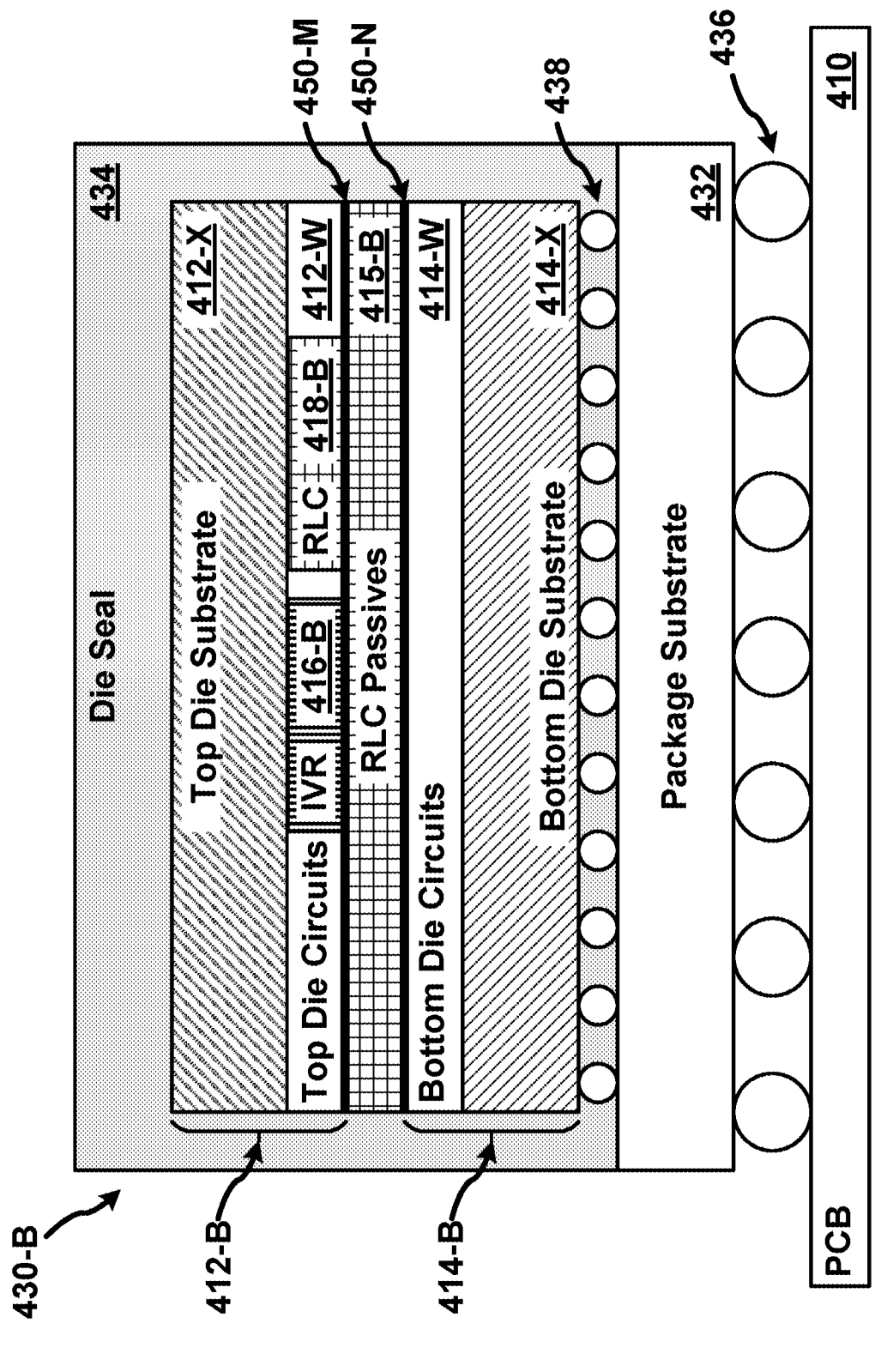
FIG. 4B is not drawn to scale and illustrates a portion of a system 400-B with details of a cross section of a package 430-B according to an embodiment of the present invention.

FIG. 4B is not drawn to scale and illustrates a portion of a system 400-B with details of a cross section of a package 430-B according to an embodiment of the present invention. System 400-B comprises PCB 410 with package 430-B mounted onto it by means of solder balls 436. Package 430-B further comprises top integrated circuit (IC) 412-B, RLC passives die 415-B, bottom integrated circuit die 414-B, and die seal 434. Top integrated circuit 412-B comprises a circuit portion 412-W and a substrate portion 414-X. Similarly, bottom integrated circuit 414-B comprises a circuit portion 414-W and a substrate portion 414-X.

Top integrated circuit 412-B may be both physically and electrically coupled to RLC 415-B at interface 450-M using, for example, a die-to-die or wafer-to-wafer bonding technology like, for example, DBI®. Similarly, RLC 415-B may also be both physically and electrically coupled to bottom integrated circuit 414-B at interface 450-N using, for example, a die-to-die or wafer-to-wafer bonding technology like, for example, DBI®.

The circuit portion 412-W of top IC 412-B further comprises integrated voltage regulator (IVR) 416-B and RLC passives 418-B. This allows better electrical performance because of the proximity of IVR 416-B to a select portion of the components of RLC 415-B that are directly coupled between them at interface 450-M, while other components with less critical layout constraints may be placed elsewhere on RLC 415-B. Further, it allows IVR 416-A to be placed in a location that is optimal for the circuits it regulates power for in either IC 412-A or IC 414-A. The proximity of RLC passives 418-B on IC 412-B to RLC die 415-B further allows the creation of unique passive components having two portions coupled together at interface 450-M. Such unique two-die passive components may have advantages over components formed in a single die due to the reduced complexity of processing one or both of IC 412-B and RLC 415-B.

Figure 4C:
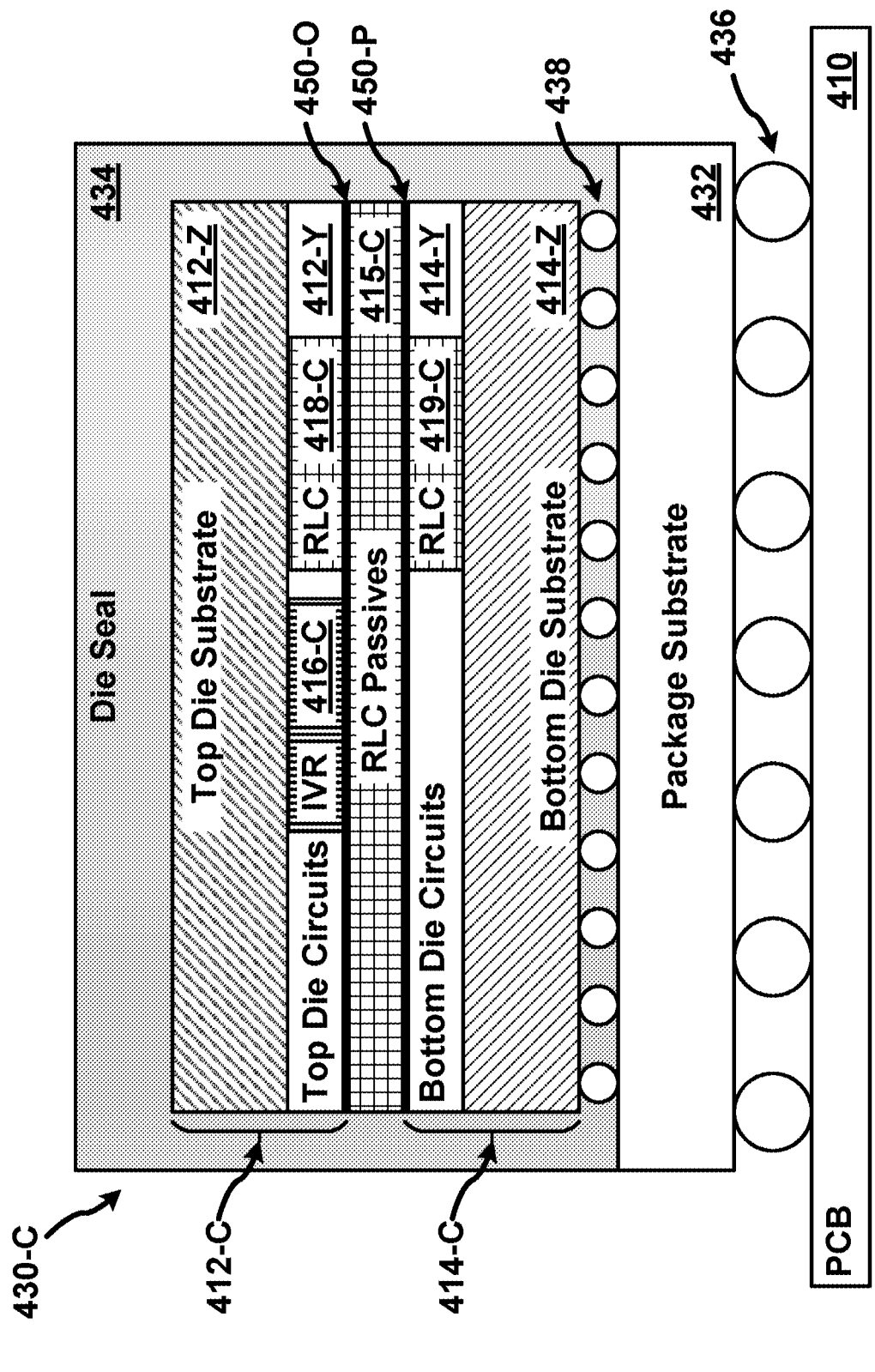
FIG. 4C is not drawn to scale and illustrates a portion of a system 400-C with details of a cross section of a package 430-C according to an embodiment of the present invention.

FIG. 4C is not drawn to scale and illustrates a portion of a system 400-C with details of a cross section of a package 430-C according to an embodiment of the present invention. System 400-C comprises PCB 410 with package 430-C mounted onto it by means of solder balls 436. Package 430-C further comprises top integrated circuit die 412-C, RLC passives die 415-C, bottom integrated circuit die 414-C, and die seal 434. Top integrated circuit 412-C comprises a circuit portion 412-Y and a substrate portion 412-Z. Similarly, bottom integrated circuit 414-C comprises a circuit portion 414-Y and a substrate portion 414-Z.

Top integrated circuit 412-C may be both physically and electrically coupled to RLC 415-C at interface 450-O using, for example, a die-to-die or wafer-to-wafer bonding technology like, for example, DBI®, a hybrid direct bonding technology available from Invensas Bonding Technologies, Inc. Similarly, RLC 415-C may also be both physically and electrically coupled to bottom integrated circuit 414-C at interface 450-P using, for example, a die-to-die or wafer-to-wafer bonding technology like, for example, DBI®.

The circuit portion 412-Y of top IC 412-C further comprises integrated voltage regulator (IVR) 416-C and RLC passives 418-C. This allows better electrical performance because of the proximity of IVR 416-C to a select portion of the components of RLC 415-C that are directly coupled between them at interface 450-O, while other components with less critical layout constraints may be placed elsewhere on RLC 415-C. The proximity of RLC passives 418-C on IC 412-C to RLC die 415-C allows the creation of unique passive components having two portions coupled together at interface 450-O. Such unique two-die passive components may have advantages over components formed in a single die like, for example, due to reduced complexity of processing one or both of IC 412-C and RLC 415-C.

Further, the proximity of RLC passives 418-C on IC 412-C to RLC passives 419-C on IC 414-C opposite each other across RLC die 415-C allows the creation of unique passive components having three portions coupled together at interfaces 450-O and 450-P. Such unique three-die passive components may have advantages over components formed in a single die like, for example, due to reduced complexity of processing one, two, or all three of IC 412-C, RLC 415-C, and IC 412-C.

Figure 4D:
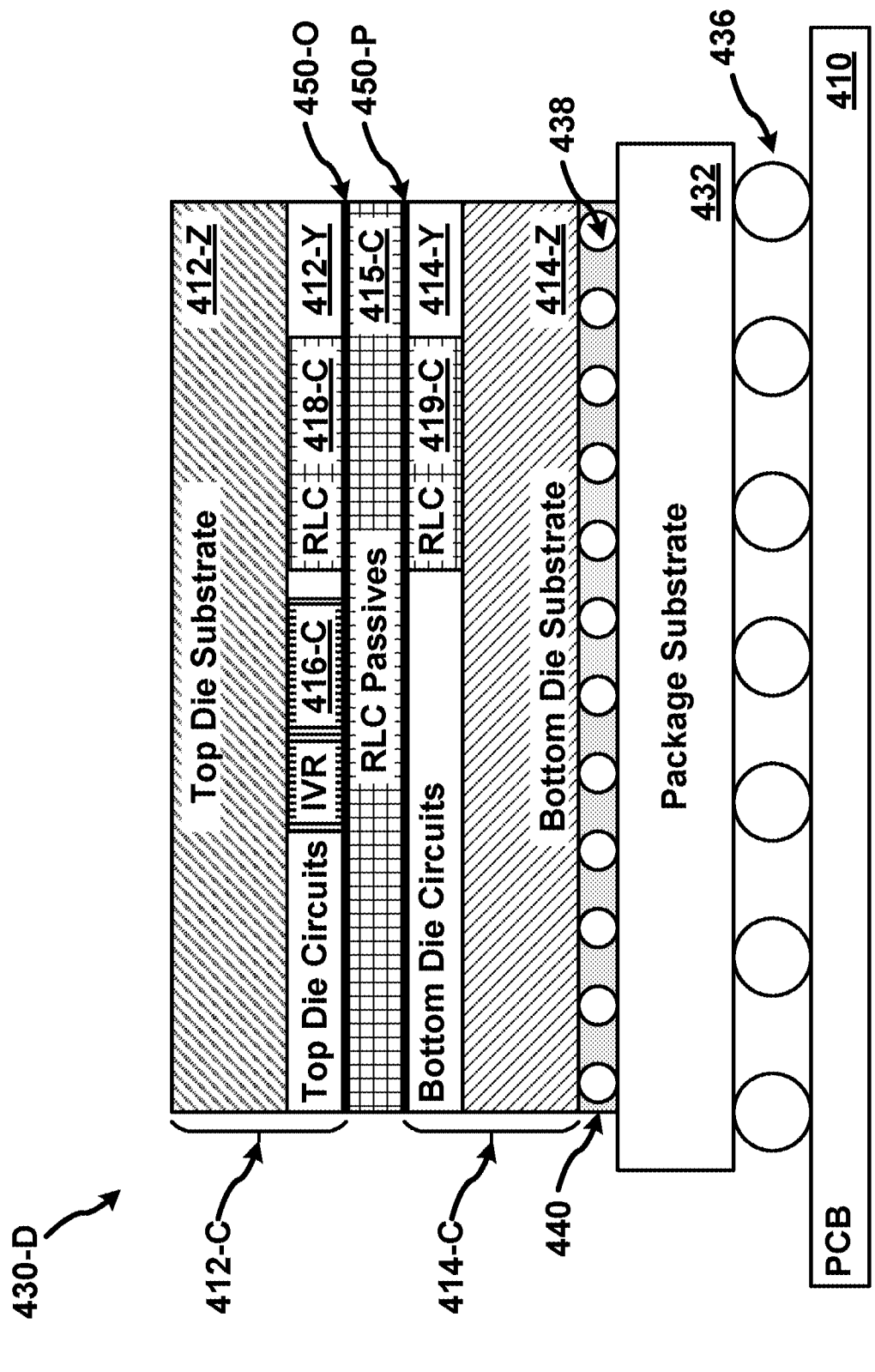
FIG. 4D is not drawn to scale and illustrates a portion of a system 400-D with details of a cross section of a package 430-D according to an embodiment of the present invention.

FIG. 4D is not drawn to scale and illustrates a portion of a system 400-D with details of a cross section of a package 430-D according to an embodiment of the present invention. The other reference numbers in the figure are identical to FIG. 4C except that die seal has been removed and replaced with an underfill-type of die seal 440. Persons skilled in the art will appreciate that while the technology employing die seal 434 has been used in many figures for simplicity of presentation, the invention may be practiced with many other packaging technologies known in the art. Further, the use of this method of presentation in no way limits the scope of invention.

Figure 5A:
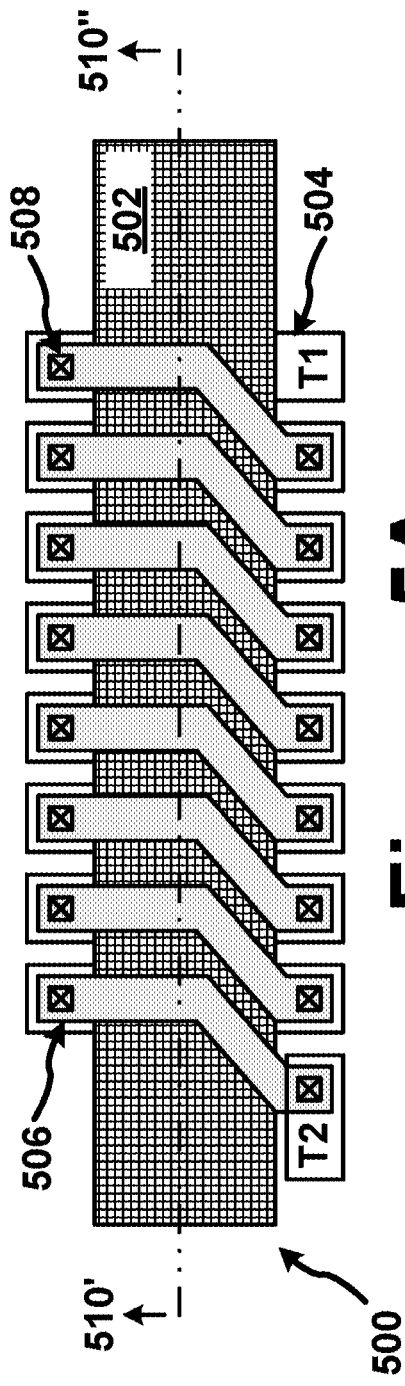
FIG. 5A is not drawn to scale and illustrates a top view of an integrated inductor 500 according to an embodiment of the present invention.

FIG. 5A is not drawn to scale and illustrates a top view of an integrated inductor 500 according to an embodiment of the present invention. Inductor 500 comprises a magnetically enhanced material 502, wires on a bottom metal layer 504, wires on a top metal layer 506, and via contacts 508 coupling together the wires on metal layers 504 and 506. Inductor 500 has two terminals T1 and T2 which may be used to couple it to other electronic components and circuits not shown in FIG. 5A. The wires on metal layers 504 and 506 are coupled together by vias 508 to form a coil-like connection between T1 and T2 that wraps around the magnetically enhanced material 502. A cross section line between 510' and 510" is shown to define the cross section of FIG. 5B.

Figure 5B:
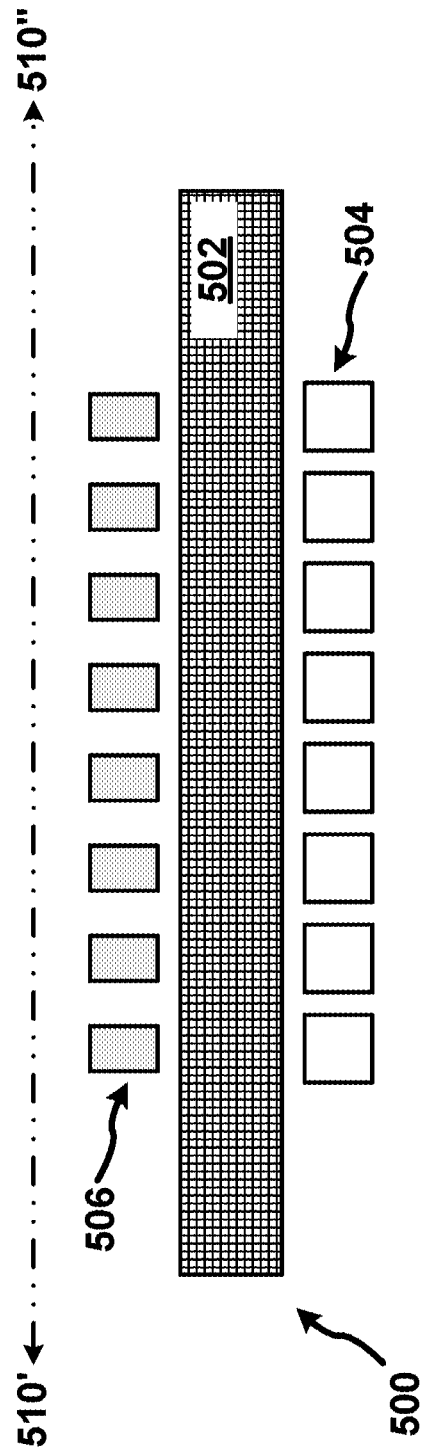
FIG. 5B is not drawn to scale and illustrates a cross section of the integrated inductor 500 according to an embodiment of the present invention.

FIG. 5B is not drawn to scale and illustrates the cross section between 510' and 510" viewed from the side of the integrated inductor 500 according to an embodiment of the present invention. Present in FIG. 5B are magnetically enhanced material 502, metal layers 504 and 506. Vias 508 are absent since they do not fall along the cross section line. At each location where there are metal wires, there is wire on bottom metal layer 504 and a parallel wire on top metal 506.

Returning to FIG. 5A, each of the wires on top metal layer 506 jogs one wire pitch as it approaches the end of its loop around magnetically enhanced material 502. This creates the coil-like structure wrapped around magnetically enhanced material 502 needed to create a high inductance value for the inductor 500.

Figure 5C:
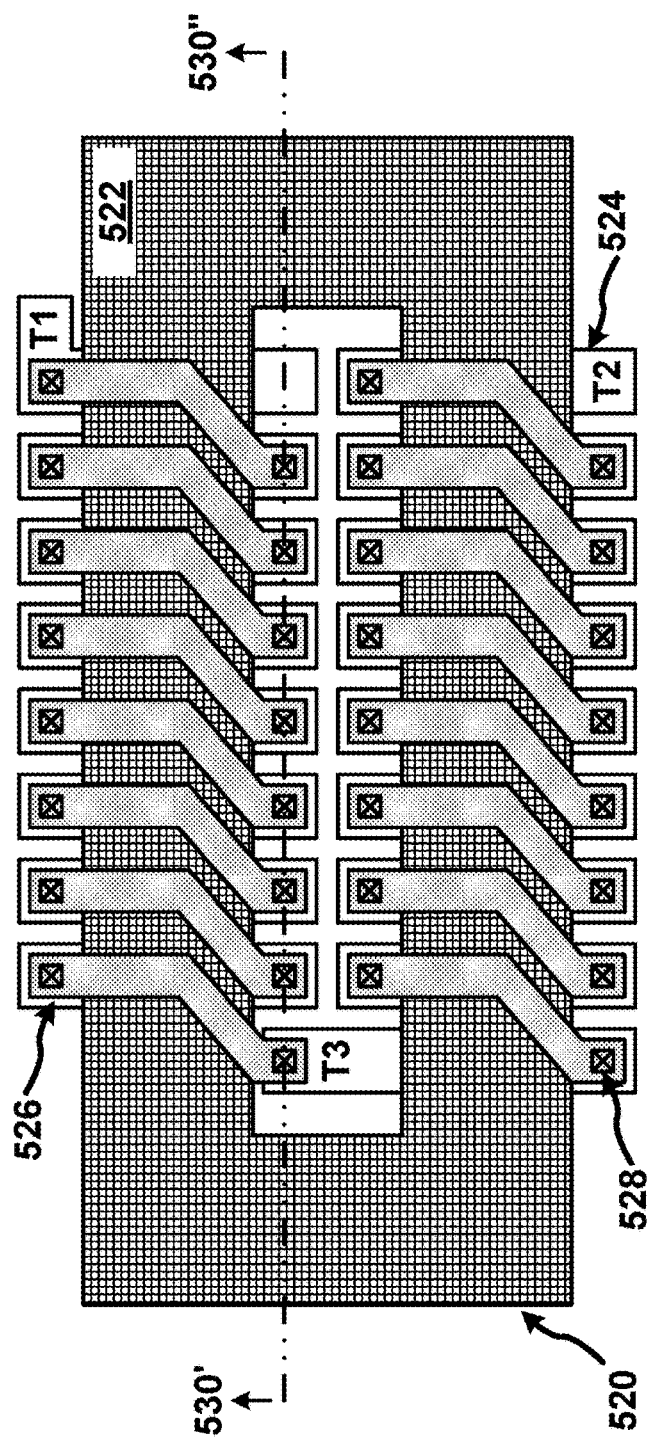
FIG. 5C is not drawn to scale and illustrates a top view an integrated inductor 520 according to an embodiment of the present invention.

FIG. 5C is not drawn to scale and illustrates a top view an integrated inductor 520 according to an embodiment of the present invention. Inductor 520 comprises a magnetically enhanced material 522, wires on a bottom metal layer 524, wires on a top metal layer 526, and via contacts 528, which couple together the wires on metal layers 524 and 526. Inductor 520 has three terminals T1, T2, and T3 which may be used to couple it to other electronic components and circuits not shown in FIG. 5C. The wires on metal layers 524 and 526 are coupled together by vias 528 to form a coil-like connection between terminals T1 and T2 that wraps around the magnetically enhanced material 522. The terminal T3 may allow the inductor 520 to be separated into two inductors sharing a common node, a configuration that may be used as a transformer. A cross section line between 530' and 530" is shown to define the cross section of FIG. 5D.

Figure 5D:
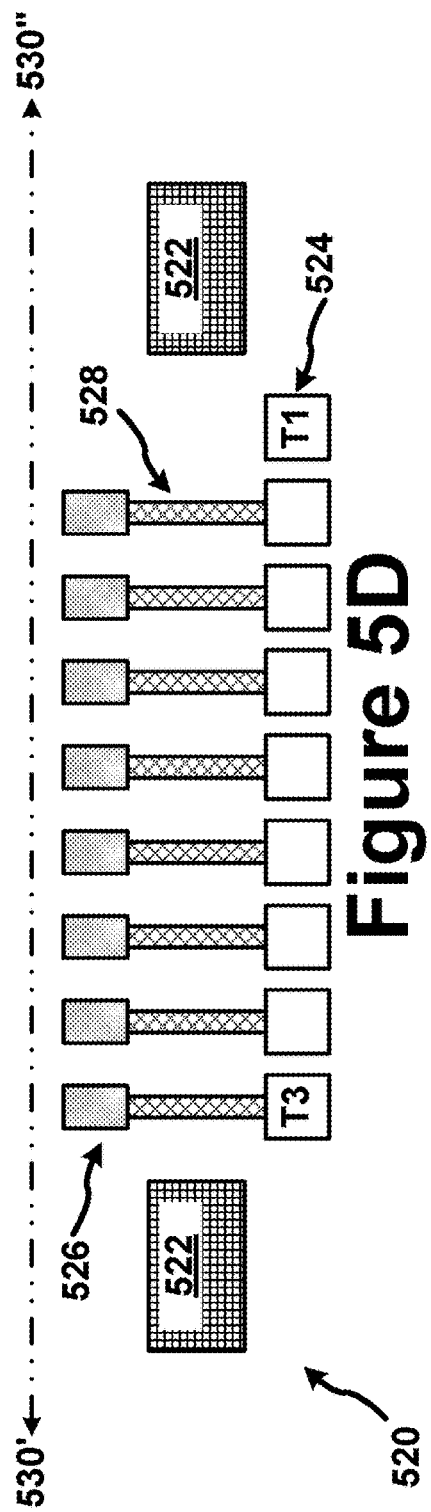
FIG. 5D is not drawn to scale and illustrates a cross section of the integrated inductor 520 according to an embodiment of the present invention.

FIG. 5D is not drawn to scale and illustrates the cross section between 530' and 530" viewed from the side of the integrated inductor 520 according to an embodiment of the present invention. Present in FIG. 5D are magnetically enhanced material 522, metal layers 524 and 526, and vias 528. At each location where there is a via 528, there is the end of a wire on bottom metal layer 524 and the end of a parallel wire on top metal 526 coupled together by the via 528.

Returning to FIG. 5C, each of the wires on top metal layer 526 jogs one wire pitch as it approaches the end of its loop around magnetically enhanced material 522. This creates the coil-like structure wrapped around magnetically enhanced material 522 needed to create a high inductance value for the inductor 520.

Figure 5E:
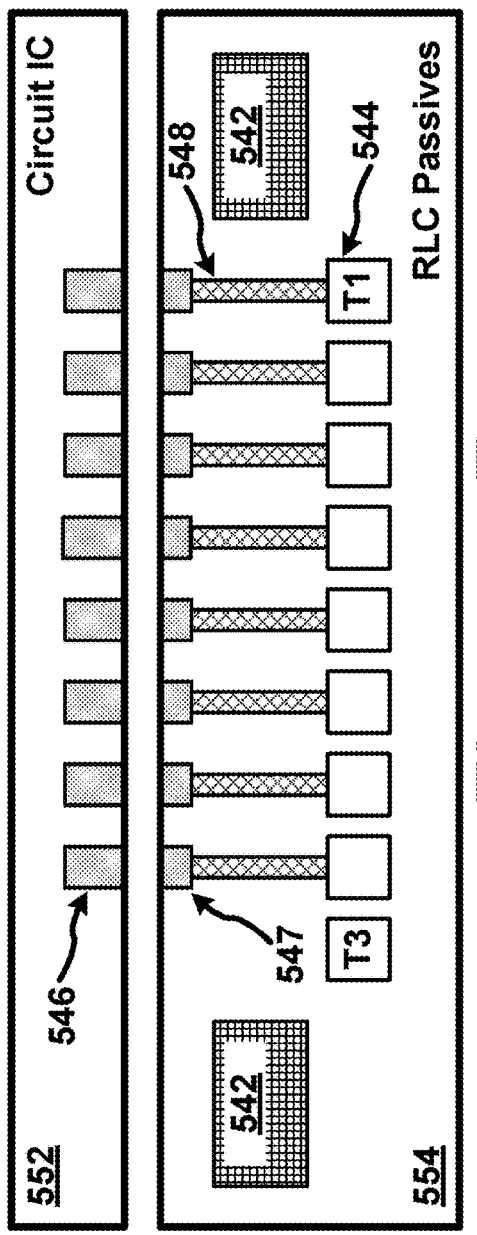
FIG. 5E is not drawn to scale and illustrates a cross section of two portions of an integrated inductor 540 prior to assembly according to an embodiment of the present invention.

FIG. 5E is not drawn to scale and illustrates a cross section of two portions of an inductor 540 prior to assembly according to an embodiment of the present invention. Inductor 540 has top view like the one illustrated for inductor 520 in FIGS. 5A and 5B—with reference numerals in the format 52x being replaced by reference numerals in the format 54x (i.e., by adding 20 to each). The reference numerals for the cross section between 530' and 530" viewed from the side are the same.

When assembled, inductor 540 comprises a magnetically enhanced material 542, wires on a bottom metal layer 544, wires on a top metal layer 546, and via contacts 548, which couple together the wires on metal layers 544 and 546. Inductor 540 has three terminals T1, T2, and T3 which may be used to couple it to other electronic components and circuits not shown in FIG. 5E. The wires on metal layers 544 and 546 are coupled together by vias 548 to form a coil-like connection between terminals T1 and T2 that wraps around the magnetically enhanced material 542. The terminal T3 may allow the inverter 540 to be separated into two inductors sharing a common node, a configuration that may be used as a transformer.

Inverter 540 is shown in two parts in FIG. 5E with top metal 546 in a circuit IC die 552 currently separated from the remainder of inductor 540 present in RLC passives die 554. Also present in RLC 554 are metal bond pads 547 coupled to vias 548. This allows for the two portions of inductor 540 to be electrically coupled when IC 552 and RLC 554 are physically coupled together at a future time. Persons skilled in the art will appreciate that little or no special processing may be required for IC 552 beyond that needed for the bonding process employed like, for example, DBI®, and that the normal thick top metal on circuit die 552 may be used as metal layer 546.

Figure 5F:
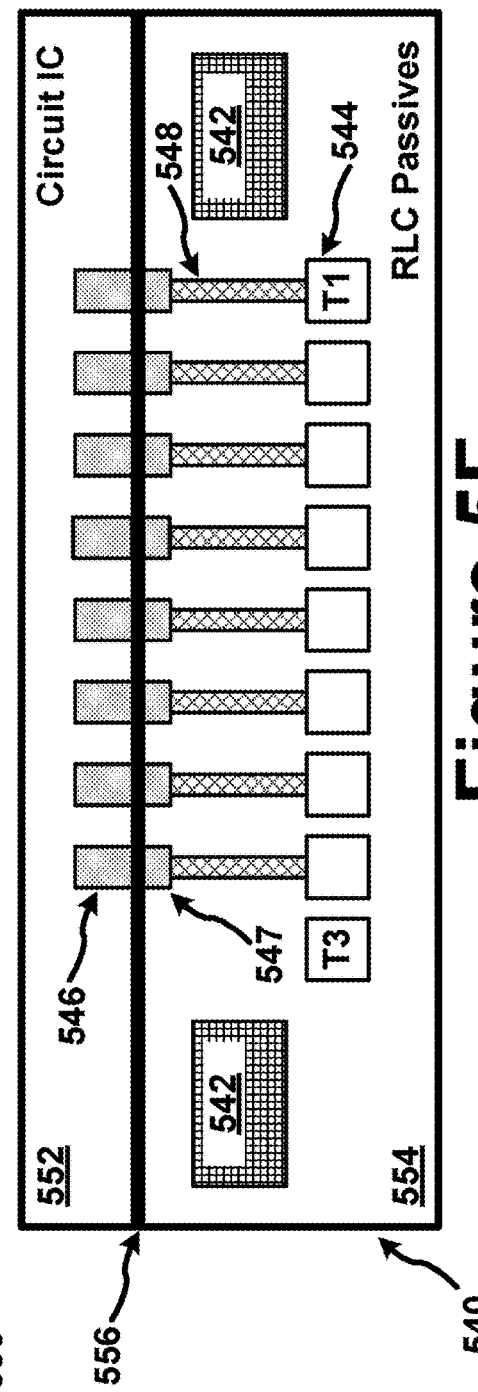
FIG. 5F is not drawn to scale and illustrates a cross section of the integrated inductor 540 after assembly according to an embodiment of the present invention.

FIG. 5F is not drawn to scale and illustrates a cross section of the inductor 540 after assembly according to an embodiment of the present invention. Present in FIG. 5F are all the elements previously described with respect to FIG. 5E.

In FIG. 5F, circuit IC die 552 may be physically and electrically coupled together with RLC die 554 at interface 556 using, for example, DBI®. At the interface 556, when DBI® technology is used, the oxide on the bottom of IVR 552 and the oxide on the top of RLC 554 bond together, physically coupling them together. Then a low temperature anneal process causes enough metal migration for top metal wires 546 and bond pads 547 to electrically couple together with high reliability. When the process is complete, inductor 540 is fully formed and functional.

Inductor 500 in FIGS. 5A and 5B and inductor 520 in FIGS. 5C and 5D are illustrated generically without any indication of how they are physically constructed. For example, they could be completely within an RLC die or formed across multiple dies. Inductor 540 in FIG. 5F is an example of the two-die passive components discussed previously in regards to FIGS. 4B and 4C.

Figure 6A:
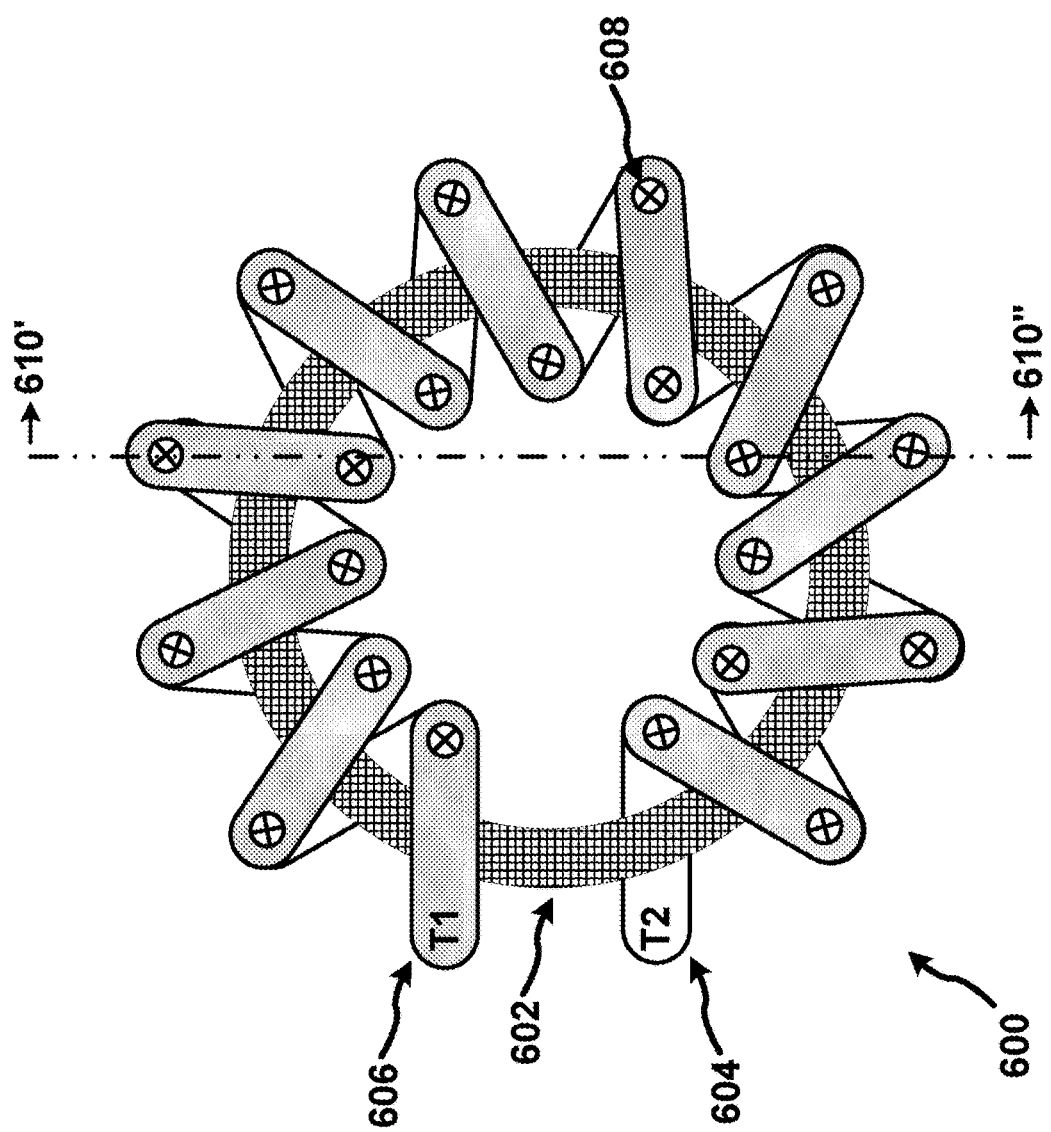
FIG. 6A is not drawn to scale and illustrates a top view of an annular integrated inductor 600 according to an embodiment of the present invention.

FIG. 6A is not drawn to scale and illustrates a top view of an embedded annular inductor 600 according to an embodiment of the present invention. Embedded annular inductor 600 comprises a circular ring 602 of magnetically enhanced material, wires on a bottom metal layer 604, wires on a top metal layer 606, and vias 608 coupling together the wires on metal layers 604 and 606. Embedded annular inductor 600 has two terminals T1 and T2 which may be used to couple it to other electronic components and circuits not shown in FIG. 6A. The wires on metal layers 604 and 606 are coupled together by vias 608 to form a coil-like connection between T1 and T2 that wraps around the magnetically enhanced material 502 to create a high inductance value. A cross section line between 610' and 610" is shown to define the cross sections illustrated in the FIGS. 6B, 6C, 6D, 6E, and 6F.

Figure 6B:
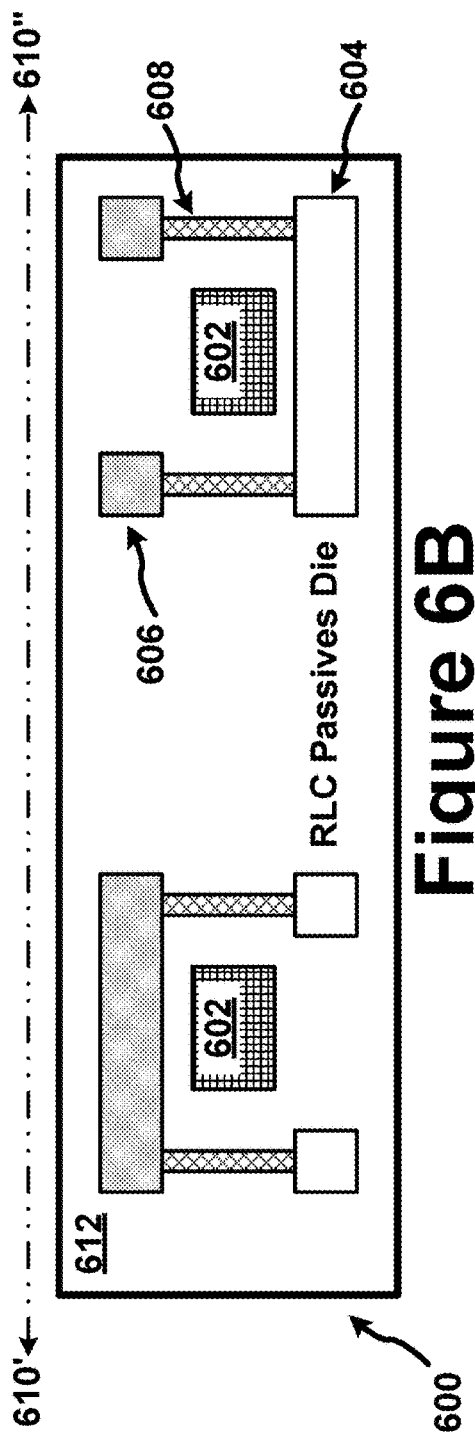
FIG. 6B is not drawn to scale and illustrates a cross section of the annular integrated inductor 600 according to an embodiment of the present invention.

FIG. 6B is not drawn to scale and illustrates a cross section of the embedded annular inductor 600 according to an embodiment of the present invention. Present in FIG. 6B are all the elements previously described with respect to FIG. 6A. Embedded annular inductor 600 is an example of a passive component constructed entirely embedded in RLC passives die 612. Embedded annular inductor 600 has two terminals T1 and T2 (not shown in FIG. 6B) which may be used to couple it to other electronic components and circuits not shown in FIG. 6B.

In FIG. 6B, ring 602 passes through the cross section plane defined by 610' and 610" in two places. At the crossing near 610', a wire of top metal 606 is shown passing over ring 602 and coupled to two different wires of bottom metal 604 through two vias 608. Similarly, at the crossing near 610", a wire of bottom metal 604 is shown passing under ring 602 and coupled to two different wires of top metal 606 through two vias 608. A series of these connections around ring 602 coupled between T1 and T2 (not shown in FIG. 6B) create the coil-like structure needed to create a high inductance value.

Figure 6C:
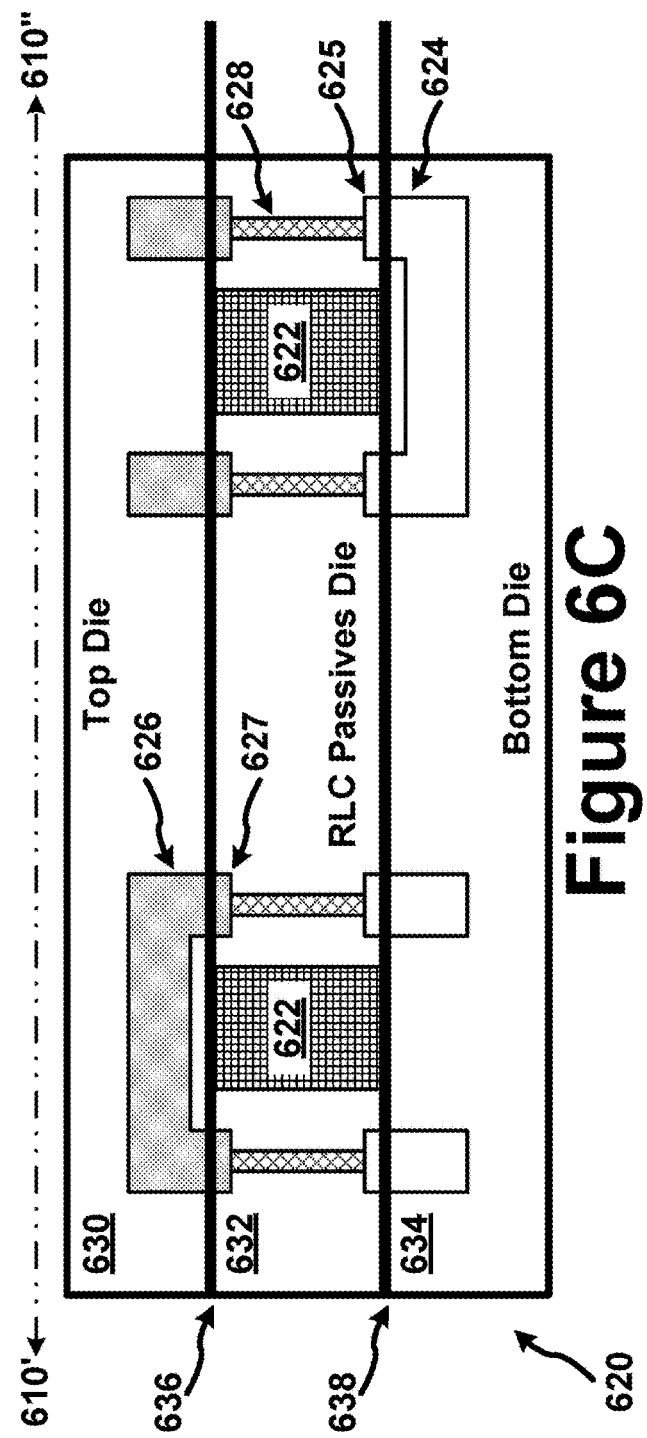
FIG. 6C is not drawn to scale and illustrates a cross section of an annular integrated inductor 620 according to an embodiment of the present invention.

FIG. 6C is not drawn to scale and illustrates a cross section of an embedded annular inductor 620 according to an embodiment of the present invention. The top diagram of embedded annular inductor 620 is not shown, but it would be identical to that of embedded annular inductor 600 in FIG. 6A except that all reference numbers in the range 600 to 609 would be increased by a value of 20 to become reference numbers in the range 620 to 629. The cross section reference labels 610' and 610" remain the same.

Embedded annular inductor 620 comprises a circular ring 622 of magnetically enhanced material, wires on a bottom metal layer 624, wires on a top metal layer 626, and vias 628 coupling together the wires on metal layers 624 and 626. Embedded annular inductor 620 has two terminals T1 and T2 (not shown in FIG. 6C) which may be used to couple it to other electronic components and circuits not shown in FIG. 6C. The wires on metal layers 624 and 626 are coupled together by vias 628 to form a coil-like connection between T1 and T2 that wraps around the magnetically enhanced material 622 to create a high inductance value.

Embedded annular inductor 620 is an example of the three-die passive components discussed previously in regards to FIG. 4C. Also present in FIG. 6C are top die IC 630, RLC die 632, and bottom die IC 634. Bottom layer metal 624 is present in bottom die 634, top layer metal 626 is present in top die 630, and the magnetically enhanced ring 622 and vias 628 are present in RLC 632. Also present in RLC 632 are bond pads 625 and 627, which allow electrical coupling to bottom metal 624 and top metal 626, respectively, when the dies are physically and electrically coupled together to form the complete and functional embedded annular inductor 620.

Ring 622 is illustrated as completely spanning RLC 632 from top to bottom. This can be accomplished by etching a circular trench and filling it with the magnetically enhanced material. This has the advantage of allowing the top and bottom of ring 622 to be extremely close to top metal 626 and bottom metal 624 respectively with little more than, for example, the thin bonding oxide used as part of the DBI® process previously discussed. As persons skilled in the art will appreciate, both metal layer 624 and metal layer 626 can be implemented using the thick top metal layers typically present in IC 634 and IC 630, respectively. Such skilled persons will also appreciate that the final thickness of RLC die 632 is less than its thickness when the magnetically enhanced ring 622 is defined and the circular trench is etched. This prevents the material in the center of ring 622 from detaching. Ultimately, RLC die 632 is then thinned to its final thickness later in the manufacturing process.

Figure 6D:
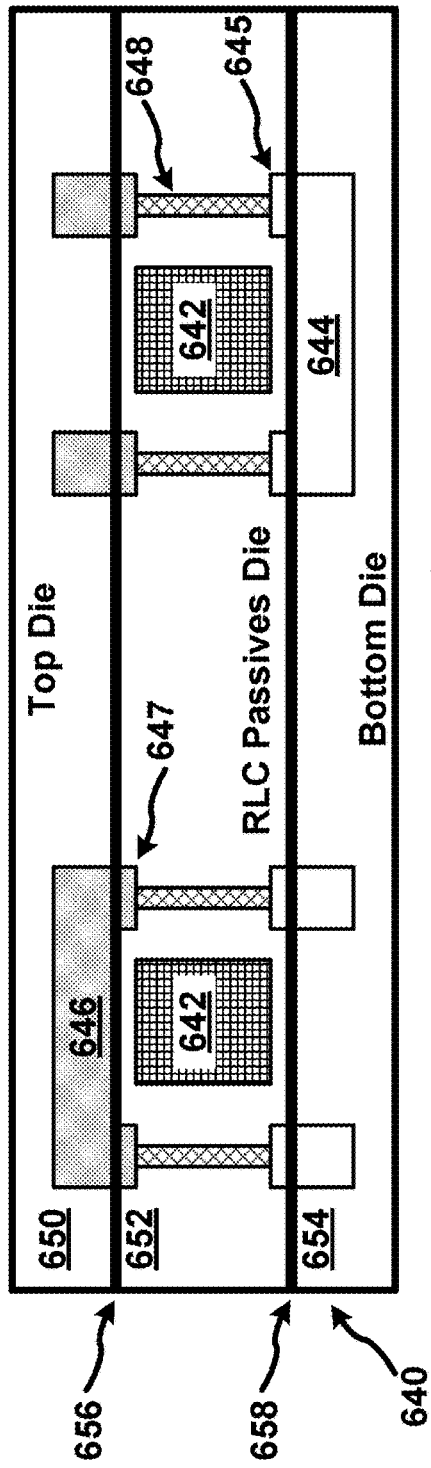
FIG. 6D is not drawn to scale and illustrates a cross section of an annular integrated inductor 640 according to an embodiment of the present invention.

FIG. 6D is not drawn to scale and illustrates a cross section of an embedded annular inductor 640 according to an embodiment of the present invention. The top diagram of embedded annular inductor 640 is not shown, but it would be identical to that of embedded annular inductor 600 in FIG. 6A except that all reference numbers in the range 600 to 609 would be increased by a value of 40 to become reference numbers in the range 640 to 649. The cross section reference labels 610' and 610" remain the same.

Embedded annular inductor 640 comprises a circular ring 642 of magnetically enhanced material, wires on a bottom metal layer 644, wires on a top metal layer 646, and vias 648 coupling together the wires on metal layers 644 and 646. Embedded annular inductor 640 has two terminals T1 and T2 (not shown in FIG. 6D) which may be used to couple it to other electronic components and circuits not shown in FIG. 6D. The wires on metal layers 644 and 646 are coupled together by vias 648 to form a coil-like connection between T1 and T2 that wraps around the magnetically enhanced material 642 to create a high inductance value.

Embedded annular inductor 640 is another example of the three-die passive components discussed previously in regards to FIG. 4C. Also present in FIG. 6D are top die IC 650, RLC die 652, and bottom die IC 654. Bottom layer metal 644 is present in IC 654, top layer metal 646 is present in IC 650, and the magnetically enhanced ring 642 and vias 648 are present in RLC 652. Also present in RLC 652 are bond pads 645 and 647, which allow electrical coupling to bottom metal 644 and top metal 646, respectively, when the dies are physically and electrically coupled together to form the complete and functional embedded annular inductor 640.

Figure 6E:
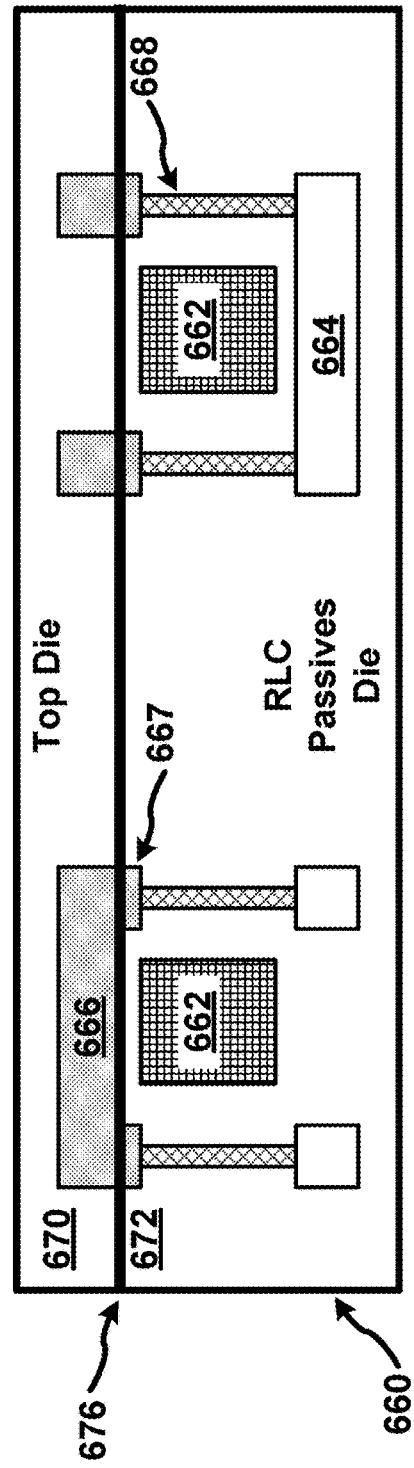
FIG. 6E is not drawn to scale and illustrates a cross section of an annular integrated inductor 660 according to an embodiment of the present invention.

FIG. 6E is not drawn to scale and illustrates a cross section of an embedded annular inductor 660 according to an embodiment of the present invention. The top diagram of embedded annular inductor 660 is not shown, but it would be identical to that of embedded annular inductor 600 in FIG. 6A except that all reference numbers in the range 600 to 609 would be increased by a value of 60 to become reference numbers in the range 660 to 669. The cross section reference labels 610' and 610" remain the same.

Embedded annular inductor 660 comprises a ring 662 of magnetically enhanced material, wires on a bottom metal layer 664, wires on a top metal layer 666, and vias 668 coupling together the wires on metal layers 664 and 666. Embedded annular inductor 660 has two terminals T1 and T2 (not shown in FIG. 6E) which may be used to couple it to other electronic components and circuits not shown in FIG. 6E. The wires on metal layers 664 and 666 are coupled together by vias 668 to form a coil-like connection between T1 and T2 that wraps around the magnetically enhanced material 662 to create a high inductance value.

Embedded annular inductor 660 is an example of the two-die passive components discussed previously in regards to FIGS. 4B and 4C. Also present in FIG. 6E are top die IC 670 and RLC die 672. Bottom layer metal 664 is present in RLC 672, top layer metal 666 is present in IC 670, and the magnetically enhanced ring 662 and vias 668 are present in RLC 672. Also present in RLC 672 are bond pads 667, which allow electrical coupling to top metal 666 when the dies are physically and electrically coupled together to form the complete and functional embedded annular inductor 660.

Figure 6F:
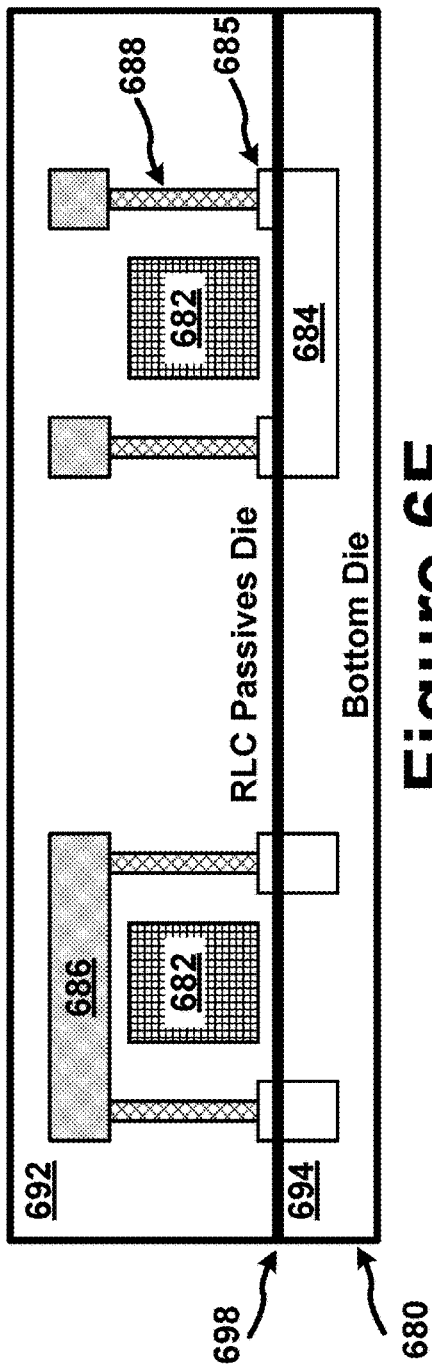
FIG. 6F is not drawn to scale and illustrates a cross section of an annular integrated inductor 680 according to an embodiment of the present invention.

FIG. 6F is not drawn to scale and illustrates a cross section of an embedded annular inductor 680 according to an embodiment of the present invention. The top diagram of embedded annular inductor 680 is not shown, but it would be identical to that of embedded annular inductor 600 in FIG. 6A except that all reference numbers in the range 600 to 609 would be increased by a value of 80 to become reference numbers in the range 680 to 689. The cross section reference labels 610' and 610" remain the same.

Embedded annular inductor 680 comprises a ring 682 of magnetically enhanced material, wires on a bottom metal layer 684, wires on a top metal layer 686, and vias 688 coupling together the wires on metal layers 684 and 686. Embedded annular inductor 680 has two terminals T1 and T2 (not shown in FIG. 6F) which may be used to couple it to other electronic components and circuits not shown in FIG. 6F. The wires on metal layers 684 and 686 are coupled together by vias 688 to form a coil-like connection between T1 and T2 that wraps around the magnetically enhanced material 682 to create a high inductance value.

Embedded annular inductor 680 is an example of the two-die passive components discussed previously in regards to FIGS. 4B and 4C. Also present in FIG. 6F are RLC die IC 692 and bottom die 694. Bottom layer metal 684 is present in IC 694. Top layer metal 686, the magnetically enhanced ring 682 and vias 688 are present in RLC 692. Also present in RLC 692 are bond pads 685, which allow electrical coupling to bottom metal 684 when the dies are physically and electrically coupled together to form the complete and functional embedded annular inductor 680.

Figure 7:
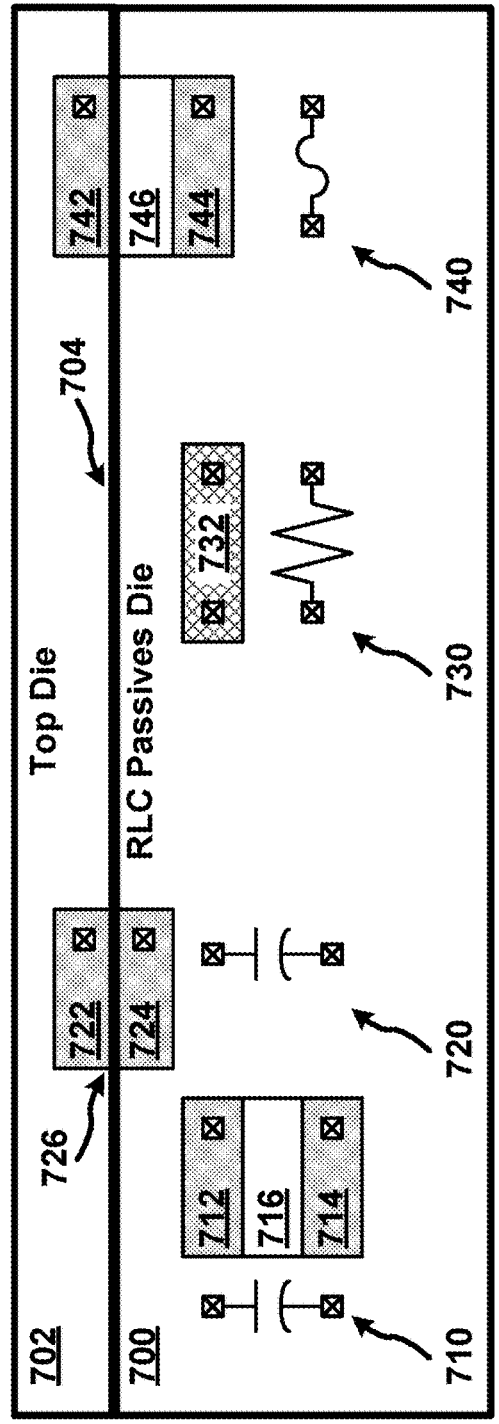
FIG. 7 is not drawn to scale and illustrates cross sections and circuit symbols of exemplary passive components which may be present in an RLC passives die 700 according to an embodiment of the present invention.

FIG. 7 is not drawn to scale and illustrates a variety of exemplary passive components which may be present in RLC passives die 700 according to an embodiment of the present invention. Top integrated circuit 702 may be both physically and electrically coupled to RLC 700 at interface 704 using, for example, a die-to-die or wafer-to-wafer bonding technology like, for example, DBI®. Also present in FIG. 7 are capacitors 710 and 720, resister 730, and fuse 740.

The schematic symbol for capacitor 710 is present in FIG. 7 with first and second terminals indicated by squares containing crossed lines. A physical representation of capacitor 710 is shown constructed with a top metal plate 712 coupled to the first terminal, a bottom metal plate 714 coupled to the second terminal, and a dielectric insulator 716 coupled in between. The terminals here are also indicated by squares containing crossed lines. Capacitor 710 is preferably a metal-insulator-metal (MIM) capacitor and with the dielectric insulator 716 preferably comprising a high-K dielectric, though other types of capacitors and insulators may be used as is known in the art. MIM capacitors are advantageous because they are very thin in the vertical direction and a plurality of them may be stacked one above another to increase the capacitance per area in RLC-700.

The schematic symbol for capacitor 720 is present in FIG. 7 with first and second terminals indicated by squares containing crossed lines. A physical representation of capacitor 720 is shown constructed with a top metal plate 722 coupled to the first terminal, a bottom metal plate 724 coupled to the second terminal, and a dielectric insulator 726 coupled in between. The die-to-die or wafer-to-wafer bond 704, like, for example, DBI®, serves as the dielectric insulator 726 in the region between metal plates 722 and 724. The thickness of bond 704 will control the capacitance per unit area for capacitor 720. In one embodiment, the DBI interconnect oxide thickness is about I um (micro meter) on each side giving bond 704 a total thickness of 2 um. In other embodiments, bond 704 may be thinner with increased anneal temperature or thicker with lower anneal temperature. The actual limits are unknown and may be gated on the thinner side by anneal temp and on the thicker side by mechanical stress. The practical limits may be in the range 0.3 um-2 um per side, but the theoretical limits may be in the range of 0.1 um-5 um per side. The terminals here are also indicated by squares containing crossed lines.

The schematic symbol for resistor 730 is present in FIG. 7 with first and second terminals indicated by squares containing crossed lines. A physical representation of resistor 730 is shown constructed as a sheet of resistive material 732 between the first and second terminals as is known in the art. The terminals here are also indicated by squares containing crossed lines.

The schematic symbol for fuse 740 is present in FIG. 7 with its terminals indicated by squares containing crossed lines. A physical representation of fuse 740 is shown constructed with a top metal plate 742 coupled to the first terminal, a bottom metal plate 744 coupled to the second terminal, and fuse layer (or layers) 746 coupled in between. The terminals here are also indicated by squares containing crossed lines. Fuse 740 may be either a programmable fuse or a programmable antifuse as is known in the art. Fuse 470 is illustrated as spanning the interface 704 between RLC die 700 and top die 702, but other configurations are possible.

A fuse is normally conductive until it is programmed, so fuse layer 746 will initially be a conductive material electrically coupling top metal plate 742 and bottom metal plate 744. When programmed, fuse layer 746 will disintegrate or change in some other way breaking the connection between top metal plate 742 and bottom metal plate 744 creating an open circuit as is known in the art.

An antifuse is normally non-conductive until it is programmed, so fuse layer 746 will initially be an insulating material electrically isolating top metal plate 742 and bottom metal plate 744. When programmed, metal from top metal plate 742 and bottom metal plate 744 will fuse together into a conductive filament through fuse layer 746 making an electrical connection between top metal plate 742 and bottom metal plate 744 as is known in the art.

Figure 8A:
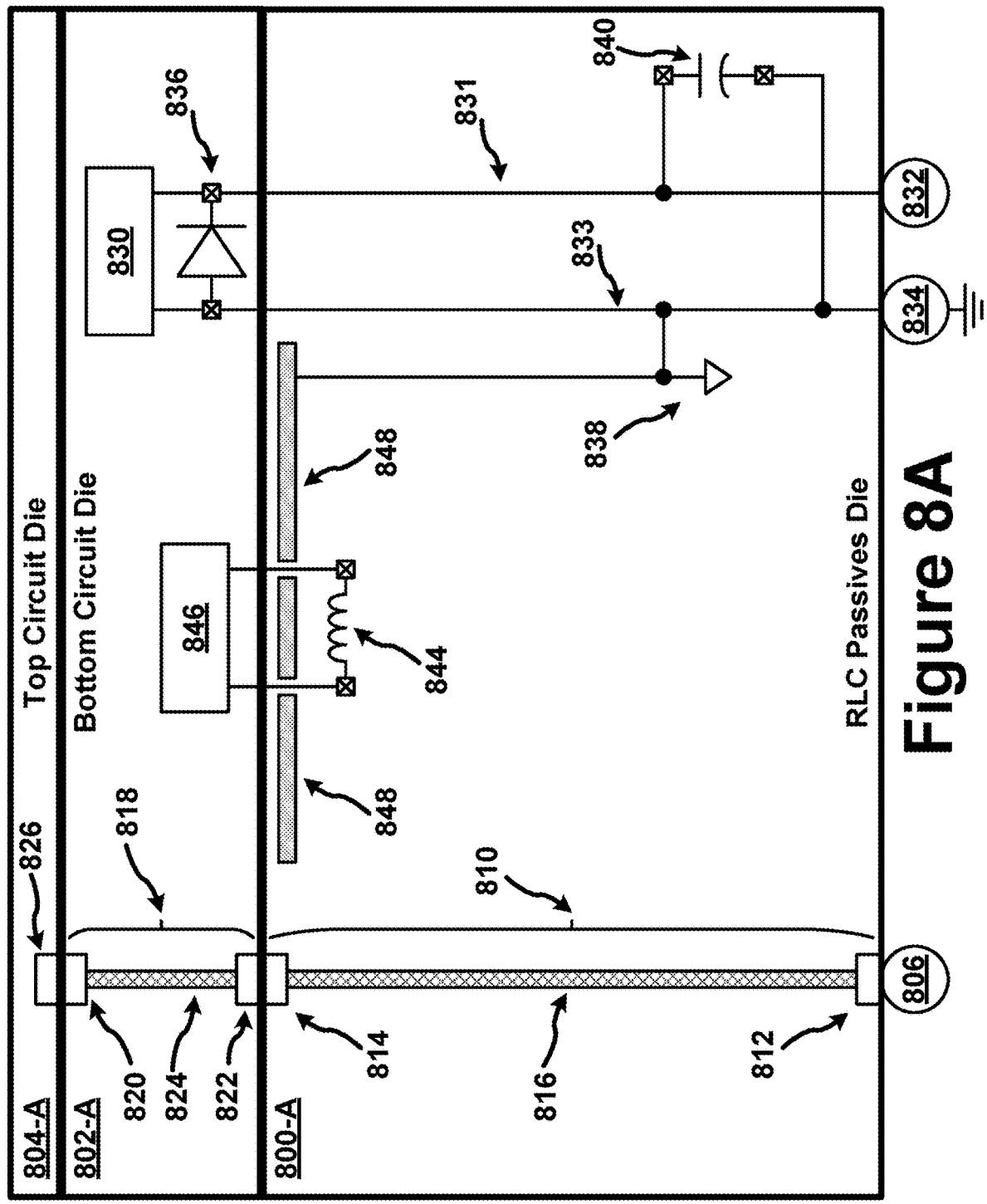
FIG. 8A is not drawn to scale and illustrates a cross section of an RLC passives die 800-A according to an embodiment of the present invention.

FIG. 8A is not drawn to scale and illustrates a cross section of an RLC passives die 800-A according to an embodiment of the present invention. This embodiment is similar to the IC stack of package 330-C illustrated in FIG. 3C. Present in FIG. 8A is RLC passives die 800-A, bottom circuit die 802-A, and top circuit die 804-A coupled together with bonding techniques of the sort discussed in conjunction with other embodiments. Also present in the figure are solder bumps 806, 832, and 834 which may be used to couple RLC 800-A to, for example, a package substrate or a printed circuit board (neither shown in FIG. 8A).

Through silicon via (TSV) 810 may allow electrical coupling through RLC 800-A between solder bump 806 and bottom circuit die 802-A. TSV 810 comprises lower bond pad 812, upper bond pad 814, and via 816. Lower bond pad 812 is metal that may couple solder bump 806 to via 816, and upper bond pad 814 is metal may couple bottom die 802-A to via 816.

TSV 818 may allow electrical coupling through bottom circuit die 802-A between RLC die 800-A and top circuit die 804 A. TSV 818 comprises upper bond pad 820, lower bond pad 822, and via 824. Lower bond pad 822 is metal that may couple bond pad 814 to via 824, and upper bond pad 820 is metal that may couple via to 824 top die 804-A. Lower bond pad 826 may be present in top die 804-A to electrically couple to upper bond pad 820.

Circuit 830 is present in the diagram and coupled to solder bumps 832 and 834 through two TSVs 831 and 833 (shown as wires for simplicity in FIG. 8A and further diagrams). Solder bump 834 is also coupled to ground through the package substrate and/or PCB (not shown in FIG. 8A). Circuit 830 can be any circuit needing electrostatic discharge (ESD) protection. While circuit 830 is illustrated as present in bottom die 802-A, persons skilled in the art will realize that it may also be present in whole or in part in RLC 800-A or top circuit die 804-A.

Diode 836 has its cathode terminal coupled to circuit 830, solder bump 832, and a first terminal of optional capacitor 840, while its anode terminal is coupled to circuit 830, solder bump 834 and an internal ground node 838. Optional capacitor 840 has a second terminal coupled to solder bump 834.

When a negative ESD event occurs at solder bump 832, the voltage on the cathode goes negative (i.e., below ground) until diode 836 turns on and safely steers the ESD current from ground by means of solder bump 834 and out of the device through solder bump 832.

When a positive ESD event occurs at solder bump 832, the voltage on the cathode goes positive (i.e., above ground) until diode 836 breaks down and safely steers the ESD current from solder bump 832 and out of the device to ground through solder bump 834.

In a typical ESD protection scheme, an ESD event on any pin will have the current (positive or negative depending on the positive or negative voltage polarity of the ESD event) steered to or from the internal ground 838 which is coupled to solder bump 834 in the figure. Thus, any event between any two pins is treated as a positive ESD event on one pin and a negative ESD event on the other. Typically, internal ground node 838 is present near every bond pad and/or ESD device like diode 836 and provides a low resistance path (typically through both thick metal and/or the substrate) between all pairs of pins to prevent the ESD current from damaging the device.

Optional capacitor 840 may provide a temporary current source or sink during an ESD event on solder bump 832. By sourcing or sinking some of the ESD current during the initial stages of an ESD event, it provides additional time for diode 836 to turn on or break down before the voltage on solder bump 832 can rise or fall to a level where circuit 830 or other internal components are damaged.

Also present in FIG. 8A is inductor 844, switching power supply 846 coupled to inductor 844, and metal shield 848, the latter being coupled to internal ground 838. Depending on the application like, for example, a switching power supply as in this embodiment, inductor 844 may generate substantial electro-magnetic interference (EMI). In such embodiments, EMI shielding like metal shield 848 can be placed between inductor 844 (or any other noisy circuit or component on RLC 800-A) to prevent interference with sensitive circuits or nodes anywhere in the die stack comprising 800-A, 802-A, and 804-A (or anywhere else in the package or system). Persons skilled in the art will realize that FIG. 8A is a two dimensional cross section of a three dimensional structure and that most of shield 848 will extend further into or out of the illustrated cross-section of RLC die 800-A in the third physical dimension and that typically all portions of metal shield 848 will be coupled to internal ground 838 though this is not illustrated in the figure.

Figure 8B:
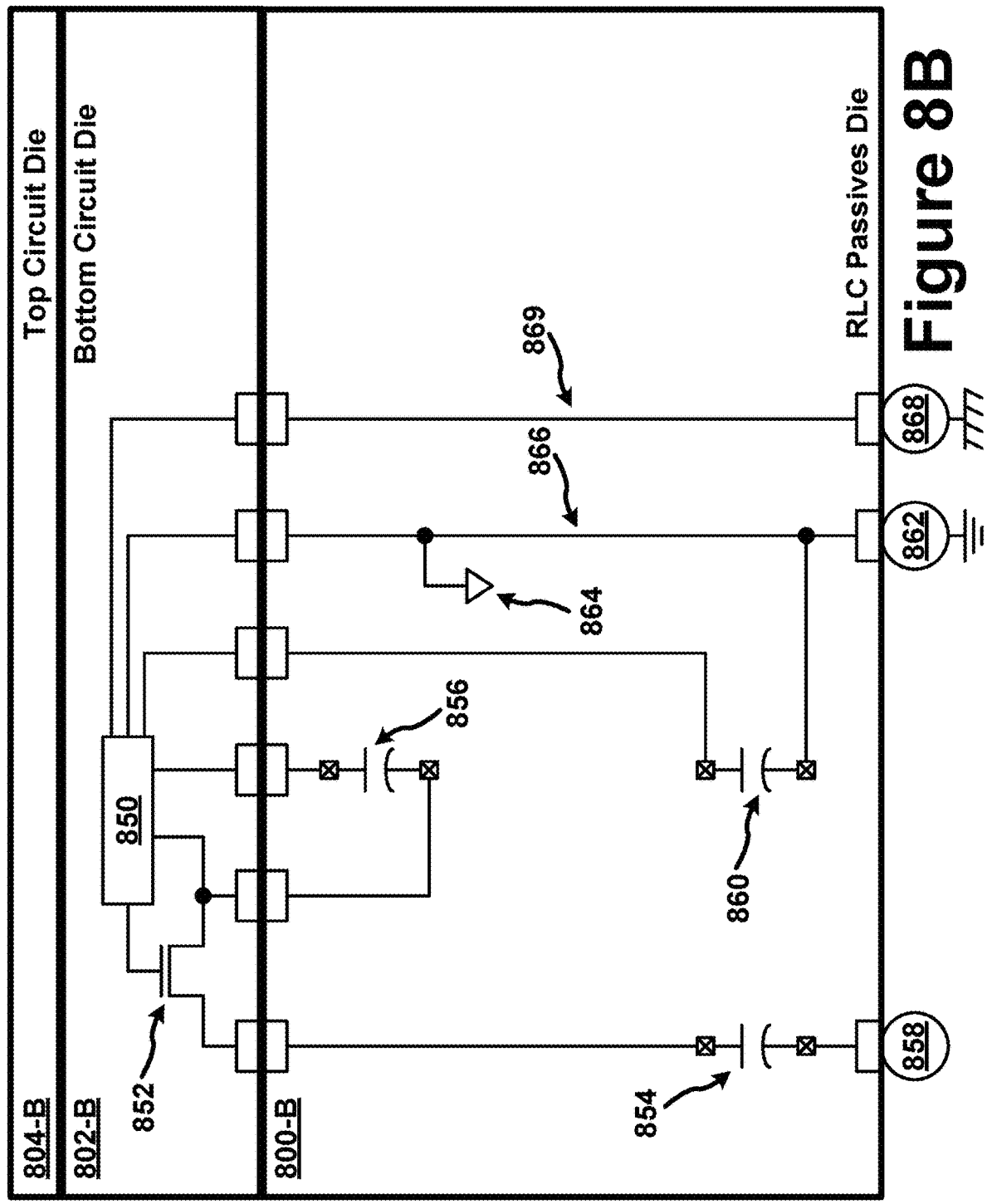
FIG. 8B is not drawn to scale and illustrates a cross section of an RLC passives die 800-B according to an embodiment of the present invention.

FIG. 8B is not drawn to scale and illustrates a cross section of an RLC passives die 800-B according to an embodiment of the present invention. This embodiment is similar to the IC stack of package 330-C illustrated in FIG. 3C. Present in FIG. 8B is RLC passives die 800-B, bottom circuit die 802-B, and top circuit die 804-B coupled together with bonding techniques of the sort discussed in conjunction with other embodiments. Also present in the figure are solder bumps 858, 862, and 868 which may be used to couple RLC 800-B to, for example, a package substrate or a printed circuit board (neither shown in FIG. 8B).

Also present in FIG. 8B are switching power supply 850 of a type known in the art, like, for example, a switched capacitor supply, and transistor switch 852, both present in bottom circuit die 802-B. Transistor switch 852 has a gate terminal coupled to switching power supply 850, a first source/drain terminal coupled to a first terminal of capacitor 854 in RLC die 800-B, and a second source/drain terminal coupled to switching power supply 850 and to a first terminal of capacitor 856 in RCL die 800-B. Transistor switch 852 is shown as an N-channel MOSFET in FIG. 8B, but could also be a P-channel MOSFET or some other type of device like, for example, a bipolar junction transistor as a matter of design choice.

Solder bump 858 is coupled to a second terminal of capacitor 854. Switching power supply 850 is further coupled to a second terminal of capacitor 856. Also present in the figure is solder bump 862 coupled to external ground, internal ground 864, and to switching power supply 850 by means of TSV 866. Also shown is solder ball 868 coupled to an external power supply and switching power supply 850 by means of TSV 869

Capacitor 860 is present in RLC die 800-B having a first terminal coupled to switching power supply 850 and a second terminal coupled to external ground by means of solder bump 862. In this embodiment, RLC die has two different layers of embedded capacitors with capacitors 854 and 860 on a lower layer and capacitor 856 on an upper layer. Persons skilled in the art will appreciate that more than two layers of capacitors (or resistors, inductors, or any other passive component) may be present as a matter of design choice.

FIG. 8C is not drawn to scale and illustrates a cross section of an RLC passives die 800-C according to an embodiment of the present invention. Present in the figure are RLC die 800-C, bottom circuit die 802-C, and top circuit die 804-C bonded together using bonding techniques like those described in previous embodiments of the present invention.

Programming circuit 870 is present in bottom circuit die 802 C. It is coupled to external power and external ground by means of solder bumps 872 and 874 respectively, in series with TSVs 876 and 878 respectively.

Also coupled to programming circuit are both terminals of the fuses 880 and 882. Programming circuit 870 is configured apply the necessary electrical signals to program and read the contents of fuses 800 and 882. The data stored in the fuses may be used for a variety of functions like, for example, operating or configuration parameters of any circuitry in RLC die 800-C, bottom circuit die 802-C and top circuit die 804-C.

Figure 8D:
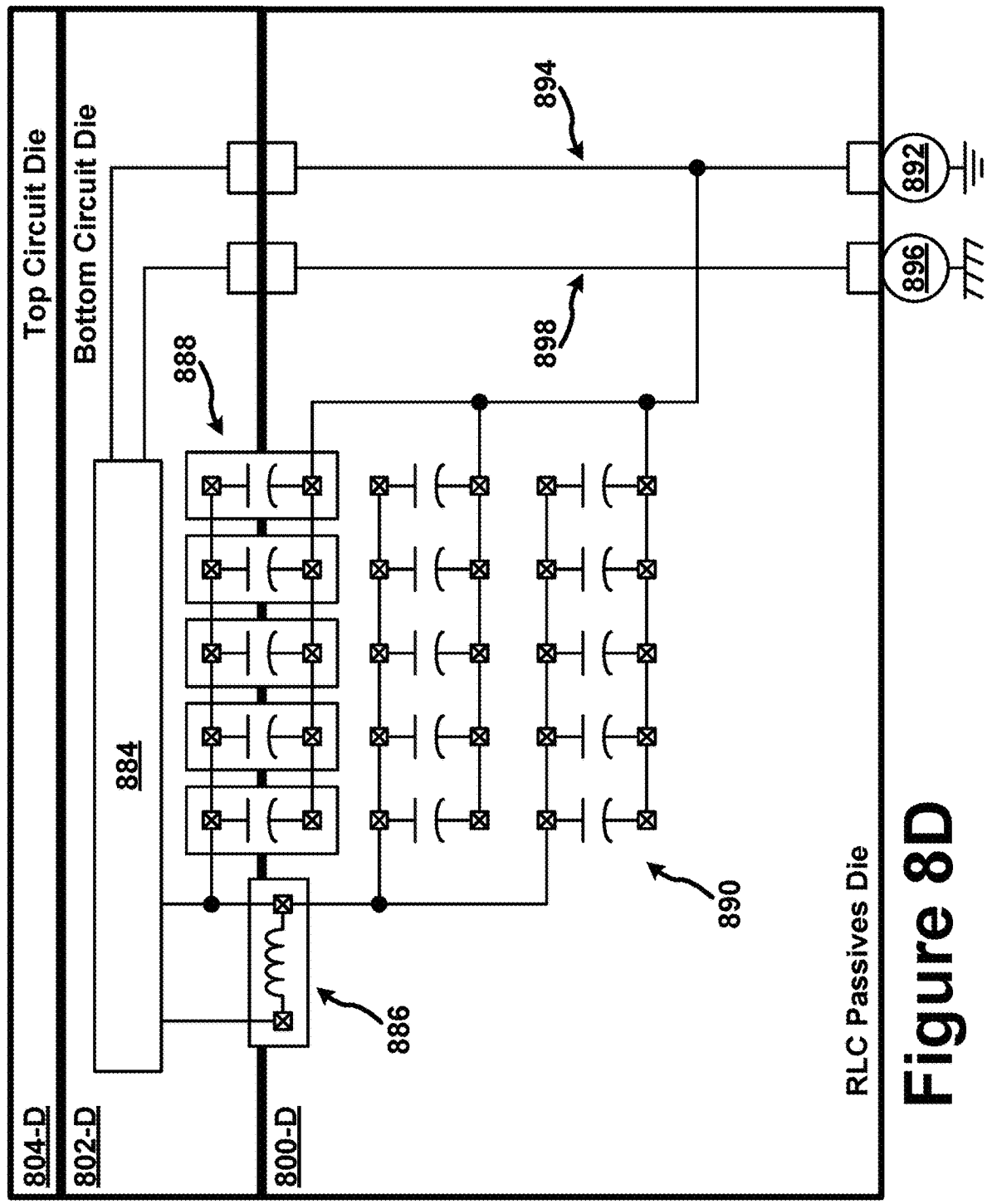
FIG. 8D is not drawn to scale and illustrates a cross section of an RLC passives die 800-D according to an embodiment of the present invention.

FIG. 8D is not drawn to scale and illustrates a cross section of an RLC passives die 800-D according to an embodiment of the present invention. This embodiment is similar to the IC stack of package 330-C illustrated in FIG. 3C. Present in FIG. 8B is RLC passives die 800-D, bottom circuit die 802-D, and top circuit die 804-D coupled together with bonding techniques of the sort discussed in conjunction with other embodiments.

Also present in the figure is switching power supply 884, two-part inductor 886, two-part capacitors 888, lower-layer capacitors 890, solder bumps 892 and 896, and TSVs 894 and 898. Switching power supply 884 may be of a type known in the art like, for example, a buck converter. Two-part inductor 886 may be partially formed in bottom circuit die 802-D and partially formed in RLC passives die 800-D in a manner similar to the inductors disclosed in FIGS. 5E, 5F, 6C, 6D, 6E and 6F. Two-part capacitors 888 may be partially formed in bottom circuit die 802-D and partially formed in RLC passives die 800-D in a manner similar to capacitor 720 in FIG. 7. Lower-layer capacitors 890 are stacked in two layers beneath the two-part capacitors 888 in a manner similar to that disclosed in FIG. 8B. Persons skilled in the art will realize that the number of layers of the lower-layer capacitors 890 is a matter of design choice and there are embodiments comprising three or more such layers.

Switching power supply 884 is coupled to a first terminal of two-part inductor 886, the first terminals of two-part capacitors 888, the first terminals of lower-layer capacitors 890, to an external ground by means of solder bump 892 and TSV 894, and to an external power source by means of solder bump 896 and TSV 898. The second terminal of two-part inductor 886 is coupled to switching power supply 884 and the first terminals of two-part capacitors 888 and the first terminals of lower-layer capacitors 890. The second terminals of two-part capacitors 888 and the second terminals of lower-layer capacitors 890 are coupled to external ground by means solder bump 892.

The advantages of the circuit configuration of FIG. 8D are (1) high value capacitance values may be obtained using two-part capacitors 888 which use the thin bonding oxide as the insulator, (2) additional layers of lower-layer capacitors 890 like, for example, metal-insulator-metal (MIM) capacitors, may be added as needed to increase the total capacitance value, (3) as much surface area as needed can be used to increase the inductance of two-part inductor 886, (4) the switching supply 884 is very close to the necessary capacitors and inductors which increases the power efficiency of the converter and keeps the interconnections lines between them short to minimize both resistance and EMI, and (5) any necessary shielding can be built close the converter and its passive components minimizing both area and the EMI emissions.

Figure 9:
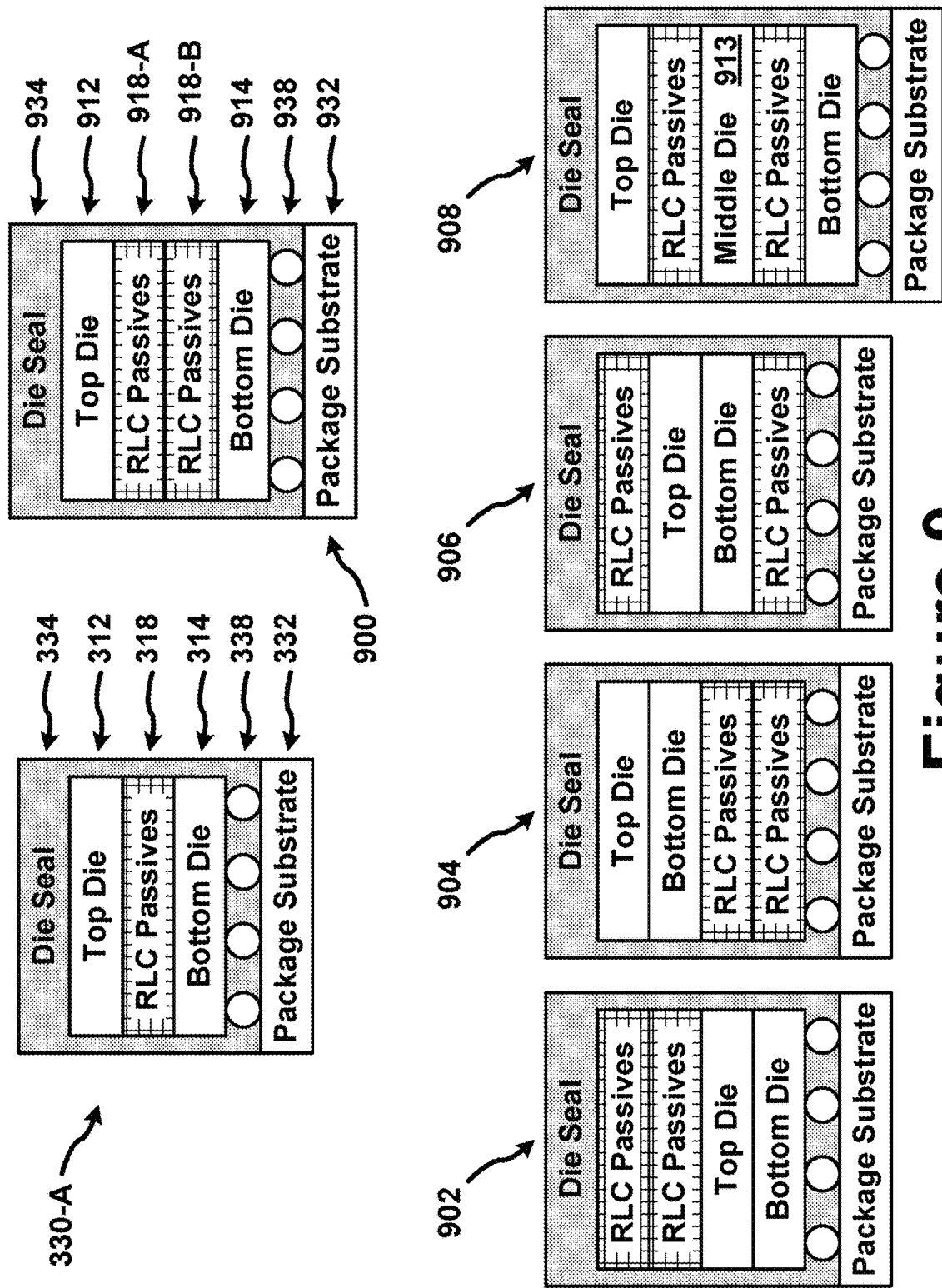
FIG. 9 is not drawn to scale and illustrates several package cross sections with illustrative internal arrangements of semiconductor dies according to embodiments of the present invention.

FIG. 9 is not drawn to scale and illustrates several package cross sections with illustrative internal arrangements of semiconductor dies according to embodiments of the present invention. Present in the figure is a simplified drawing of the embodiment of package 330-A as described in conjunction with FIG. 3A. Present in this representation of package 330-A are some of the reference numerals from FIG. 3A including package substrate 332, solder bumps 338, bottom die 314, RLC passives die 318, top die 312 and die seal 334.

Package 900 comprises package substrate 932, solder bumps 938, bottom die 914, RLC dies 918-A and 918-B, top die 912 and die seal 934. These structures are roughly analogous to their counterparts substrate 332, solder bumps 338, bottom die 314, RLC passives die 318, top die 312 and die seal 334 respectively in package 330-A, allowing for differences in design goals and choices.

Package 900 has two RLC dies 918-A and 918-B bonded together between top die 912 and bottom die 914. All four die are bonded together in a manner similar to that discussed with respect to other embodiments. Together they are coupled to package substrate 932 by means of solder bumps 938.

RLC dies 918-A and 918-B may be manufactured with different fabrication processes allowing a greater variety of RLC passive components to be present in package 900 than in the device in package 330-A.

Package 902 comprises package substrate 932, solder bumps 938, bottom die 914, RLC dies 918-A and 918-B, top die 912 and die seal 934 though the reference numerals are not shown in the figure. These structures are roughly analogous to their counterparts in package 900. The primary difference is that RLC dies 918-A and 918-B are bonded together at the top of the stack above top die 912 and bottom die 914.

Package 904 comprises package substrate 932, solder bumps 938, bottom die 914, RLC dies 918-A and 918-B, top die 912 and die seal 934 though the reference numerals are not shown in the figure. These structures are roughly analogous to their counterparts in packages 900 and 902. The primary difference is that RLC dies 918-A and 918-B are bonded together at the bottom of the die stack below top die 912 and bottom die 914.

Likewise, package 906 comprises package substrate 932, solder bumps 938, bottom die 914, RLC dies 918-A and 918-B, top die 912 and die seal 934 though the reference numerals are not shown in the figure. These structures are roughly analogous to their counterparts in packages 900, 902, and 904. The primary difference is that top die 912 and bottom die 914 are bonded together in the middle of the die stack, and bonded together with RLC dies 918-A and 918-B at the top and bottom of the stack respectively.

Persons skilled in the art will recognize that other combinations are possible and fall within the scope of the present invention. For example, such skilled persons will realize that more than four dies may be present as shown in package 908.

Package 908 comprises package substrate 932, solder bumps 938, bottom die 914, RLC die 918-A, middle die 913, RLC die 918-B, top die 912 and die seal 934 though (except for middle die 913) the reference numerals are not shown in the figure. These structures are roughly analogous to their counterparts in packages 900, 902, 904, and 906. Persons skilled in the art will realize that more than five die may be present and that many different combinations are available and within the scope of the present.

Those of ordinary skill in the art will realize that the above figures and descriptions are exemplary only. Many other embodiments will readily suggest themselves to such skilled persons after reviewing this disclosure. Thus, the invention is not to be limited in any way except by the issued claims.

What is claimed is:

1. A method of making a semiconductor package, the method comprising:
   providing a first die substrate having formed thereon a first circuit, the first circuit comprising a first portion of a passive component, the passive component selected from the group consisting of: a capacitor, an inductor, a resistor, a fuse, and an antifuse;
   providing a second die substrate having formed thereon a second circuit, the second circuit comprising a second portion of the passive component; and
   coupling the first portion of the passive component to the second portion of the passive component to complete the passive component functionally coupled to one or both of the first circuit and the second circuit.

2. The method of claim 1, further comprising:
   coupling the first circuit to the second circuit via a hybrid direct bonding technology.

3. The method of claim 1, wherein the first circuit comprises a voltage regulator circuit comprising at least one active component.

4. The method of claim 1, further comprising:
   mounting the first die substrate or the second die substrate to a first side of a package substrate after the coupling of the first portion of the passive component to the second portion of the passive component.

5. The method of claim 4, further comprising:
   covering the first die substrate, the second die substrate, and at least a portion of the first side of the package substrate with a die seal.

6. The method of claim 4, further comprising:
mounting a second side of the package substrate to a printed circuit board.

7. The method of claim 1, further comprising coupling a passive die to the first die, the second die, or both, to complete the passive component or to complete an additional passive component.

8. The method of claim 1, wherein the passive component comprises a capacitor and the method further comprises:
  (i) forming a first conductive plate adjacent a first bonding layer at a surface of the first circuit to form the first portion of the passive component;
  (ii) forming a second conductive plate adjacent a second bonding layer at a surface of the second circuit to form the second portion of the passive component; and
  (iii) coupling the first bonding layer to the second bonding layer to form an insulator layer coupled between the first conductive plate and the second conductive plate.

9. The method of claim 1, further comprising:
  (i) forming a first bonding layer having a first thickness in a range from 0.1 micrometers to 5.0 micrometers; and
  (ii) forming a second bonding layer having a second thickness in a range from 0.1 micrometers to 5.0 micrometers.

10. The method of claim 1, wherein the passive component comprises an inductor and the method further comprises:
  forming a data processing circuit; and
  forming an electromagnetic shield between the data processing circuit and the inductor.

11. The method of claim 1, further comprising:
forming at least a portion of a second passive component in the first circuit, the second passive component selected from the group consisting of: a capacitor, an inductor, a resistor, a fuse, and an antifuse.

12. The method of claim 11, further comprising:
forming at least a portion of a third passive component in the second circuit, the third passive component selected from the group consisting of: a capacitor, an inductor, a resistor, a fuse, and an antifuse.

13. The method of claim 1, further comprising:
physically and electrically coupling the first circuit to the second circuit.

14. The method of claim 1, wherein the first portion of the passive component comprises a metal layer fabricated as part of the first circuit.

15. The method of claim 8, wherein coupling the first bonding layer to the second bonding layer comprises direct bonding the first bonding layer to the second bonding layer.

16. A method comprising:
forming a package substrate comprising a first side and a second side opposite the first side;
coupling a first side of a first semiconductor die to the second side of the package substrate;
coupling a first bonding layer to a second side of the first semiconductor die opposite the first side of the first semiconductor die;
coupling a second bonding layer to a first side of a second semiconductor die;
forming a circuit comprising at least one active component on the first semiconductor die or the second semiconductor die;
integrating a first portion of a first passive component into the first semiconductor die;
integrating a second portion of the first passive component into the second semiconductor die;
electrically coupling the first portion or the second portion of the first passive component to the circuit; and
completing the first passive component by coupling the second side of the first semiconductor die to the first side of the second semiconductor die.

17. The method of claim 16, further comprising:
forming a second passive component between the first passive component and the first side of the first semiconductor die, wherein the second passive component is selected from the group consisting of a capacitor, an inductor, and a resistor.

18. The method of claim 16, further comprising:
forming a second passive component between the first passive component and the second side of the second semiconductor die, wherein the second passive component is selected from the group consisting of: a capacitor, an inductor, and a resistor.

19. The method of claim 16, wherein coupling the first bonding layer to the second side of the first semiconductor die and the second bonding layer to the first side of the second semiconductor die comprises:
  (i) forming the first bonding layer of a thickness in a range from 0.3 micrometers to 2.0 micrometers; and
  (ii) forming the second bonding layer of a thickness in a range from 0.3 micrometers to 2.0 micrometers.

20. The method of claim 16, further comprising:
coupling a die seal to the package substrate and forming an underfill die seal layer between the second side of the package substrate and the first side of the first semiconductor die.

21. A method of forming a semiconductor package, the method comprising:
providing a first semiconductor die having formed thereon a circuit comprising at least one active component;
the first semiconductor die having further formed thereon a first portion of a passive component;
providing a second semiconductor die having formed thereon a second portion of the passive component;
electrically coupling the first portion or the second portion of the passive component to the voltage regulator circuit; and
completing the passive component by electrically coupling the first portion of the passive component to the second portion of the passive component by physically bonding the first semiconductor die to the second semiconductor die.

22. The method of claim 21, further comprising:
coupling a surface of the physically bonded first semiconductor die and second semiconductor die to a package substrate.

* * * * *